(12) United States Patent
Holmes et al.

(10) Patent No.: US 11,411,160 B2
(45) Date of Patent: Aug. 9, 2022

(54) SILICON-BASED JOSEPHSON JUNCTION FOR QUBIT DEVICES

(71) Applicant: International Business Machines Corporation, Armonk, NY (US)

(72) Inventors: Steven J. Holmes, Ossining, NY (US); Devendra K. Sadana, Pleasantville, NY (US); Brent A. Wacaser, Putnam Valley, NY (US); Damon Farmer, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 40 days.

(21) Appl. No.: 16/748,277

(22) Filed: Jan. 21, 2020

(65) Prior Publication Data

US 2021/0226114 A1 Jul. 22, 2021

(51) Int. Cl.
*H01L 39/24* (2006.01)
*H01L 39/02* (2006.01)
*H01L 39/22* (2006.01)

(52) U.S. Cl.
CPC ........ *H01L 39/2487* (2013.01); *H01L 39/025* (2013.01); *H01L 39/226* (2013.01); *H01L 39/2493* (2013.01)

(58) Field of Classification Search
CPC . H01L 39/2487; H01L 39/025; H01L 39/226; H01L 39/2493; H01L 39/12; H01L 39/223
See application file for complete search history.

(56) References Cited

U.S. PATENT DOCUMENTS

| | | | | |
|---|---|---|---|---|
| 7,777,343 | B2* | 8/2010 | Noguchi | H01L 23/5226 257/760 |
| 2004/0056335 | A1* | 3/2004 | Aoyagi | H01L 27/18 257/661 |
| 2008/0318411 | A1* | 12/2008 | Tsutsue | H01L 21/76808 438/627 |
| 2014/0306344 | A1* | 10/2014 | Sugawa | H01L 21/02274 257/751 |
| 2015/0179916 | A1* | 6/2015 | Pramanik | H01L 39/223 505/190 |

(Continued)

FOREIGN PATENT DOCUMENTS

CN 109 285 94 A 1/2019

OTHER PUBLICATIONS

Yun-Pil Shim & Charles Tahan, Bottom-up superconducting and Josephson junction devices inside a group-IV semiconductor, Nature Communications vol. 5, Article No. 4225 (2014) (Year: 2014).*

(Continued)

*Primary Examiner* — Mark W Tornow
(74) *Attorney, Agent, or Firm* — Amin, Turocy & Watson, LLP

(57) ABSTRACT

Techniques regarding qubit devices comprising silicon-based Josephson junctions and/or the manufacturing of qubit devices comprising silicon-based Josephson junctions are provided. For example, one or more embodiments described herein can comprise an apparatus that can include a Josephson junction comprising a tunnel barrier positioned between two vertically stacked superconducting silicon electrodes.

12 Claims, 29 Drawing Sheets

(56) References Cited

U.S. PATENT DOCUMENTS

| 2016/0148112 A1* | 5/2016 | Kwon | G06N 10/00 257/31 |
|---|---|---|---|
| 2016/0343894 A1* | 11/2016 | Shim | H01L 31/05 |
| 2019/0220769 A1* | 7/2019 | Pikulin | H01L 43/065 |

OTHER PUBLICATIONS

K. Nomura, J. Mizuno, A. Okada, S. Shoji and T. Ogashiwa, "Fabrication of a hermetic sealing device using low temperature intrinsic-silicon/glass bonding," 2015 International Conference on Electronics Packaging and iMAPS All Asia Conference (ICEP-IAAC), 2015, pp. 444-447 (Year: 2015).*

Chiodi F et al: "Proximity-induced superconductivity in all-silicon superconductor /normal-metal junctions", Physical Review B, vol. 96, Jul. 1, 2017 (Jul. 1, 2017), p. 024503, XP055806524, ISSN: 2469-9950, DOI: 10.1103/PhysRevB.96.024503 Retrieved from the Internet: URL:https://journals.aps.org/prb/pdf/10.11 03/PhysRevB.96.024503> abstract; figure 4.

Schebaum Oliver et al: Direct measurement of the spin polarization of Co2FeAl in combination with MgO tunnel barriers 11 , Journal of Applied Physics, American Institute of Physics, US, vol. 107, No. 9, May 12, 2010 (May 12, 2010), pp. 9C717-9C717, XP012134407, ISSN: 0021-8979, DOI: 10.1063/1.3358245.

Drake RE et al: Mo(x)Si(l-x) Base Electrodes for Josephson Junctions, ip.com, ip.com Inc., West Henrietta, NY, us, Sep. 1, 1978 (Sep. 1, 1978), XP013059719, ISSN: 1533-0001.

International Search Report and Written Opinion for International Application No. PCT/EP2021/050860 dated Jun. 22, 2021, 9 pages.

Chiodi, et al. "All silicon Josephson junctions." arXiv:1610.08453v1 [cond-mat.mes-hall] Oct. 26, 2016. 6 pages.

Grockowiak, et al. "Superconducting properties of laser annealed implanted Si:B epilayers." Supercond. Sci. Technol. 26 (2013) 045009 (4pp). 5 pages.

Hoummada, et al. "Absence of boron aggregates in superconducting silicon confirmed by atom probe tomography." https://hal archives-ouvertes.fr/hal-00760773, Dec. 4, 2012 5 pages.

Marcenat, et al. "Low-temperature transition to a superconducting phase in boron-doped silicon films grown on K001)-oriented silicon wafers." Physical Review B 81, 020501 (R) (2010). 4 pages.

Shim, et al. "Bottom-up superconducting and Josephson junction devices inside a group-IV semiconductor." Nature Communications, DOI: 10.1038/ncomms5225, Jul. 2, 2017. 8 pages.

Thorgrimsson, et al. "The effect of external electric fields on silicon with superconducting gallium nano-precipitates." arXiv:1911.06931v1 [physics.app-ph] Nov. 16, 2019. 11 pages.

* cited by examiner

SILICON-BASED JOSEPHSON JUNCTION FOR QUBIT DEVICES

BACKGROUND

The subject disclosure relates to one or more silicon-based Josephson junctions that can be incorporated into qubit devices, and more specifically, to Josephson junctions comprising superconducting silicon materials that can be implemented in vertical structure orientations.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatus and/or methods regarding silicon-based Josephson junctions for one or more qubit devices are described.

According to an embodiment, an apparatus is provided. The apparatus can comprise a Josephson junction comprising a tunnel barrier positioned between two vertically stacked superconducting silicon electrodes.

According to another embodiment, an apparatus is provided. The apparatus can comprise a Josephson junction comprising a dielectric tunnel barrier positioned between two superconducting silicon electrodes.

According to an embodiment, a method is provided. The method can comprise doping a portion of a silicon substrate to form a first superconducting electrode. The method can also comprise depositing a silicon layer onto the first superconducting electrode via an epitaxial growth process to form a tunnel barrier. Further, the method can comprise doping a portion of the tunnel barrier to form a second superconducting electrode to form a Josephson junction.

DETAILED DESCRIPTION

Figure 1A:
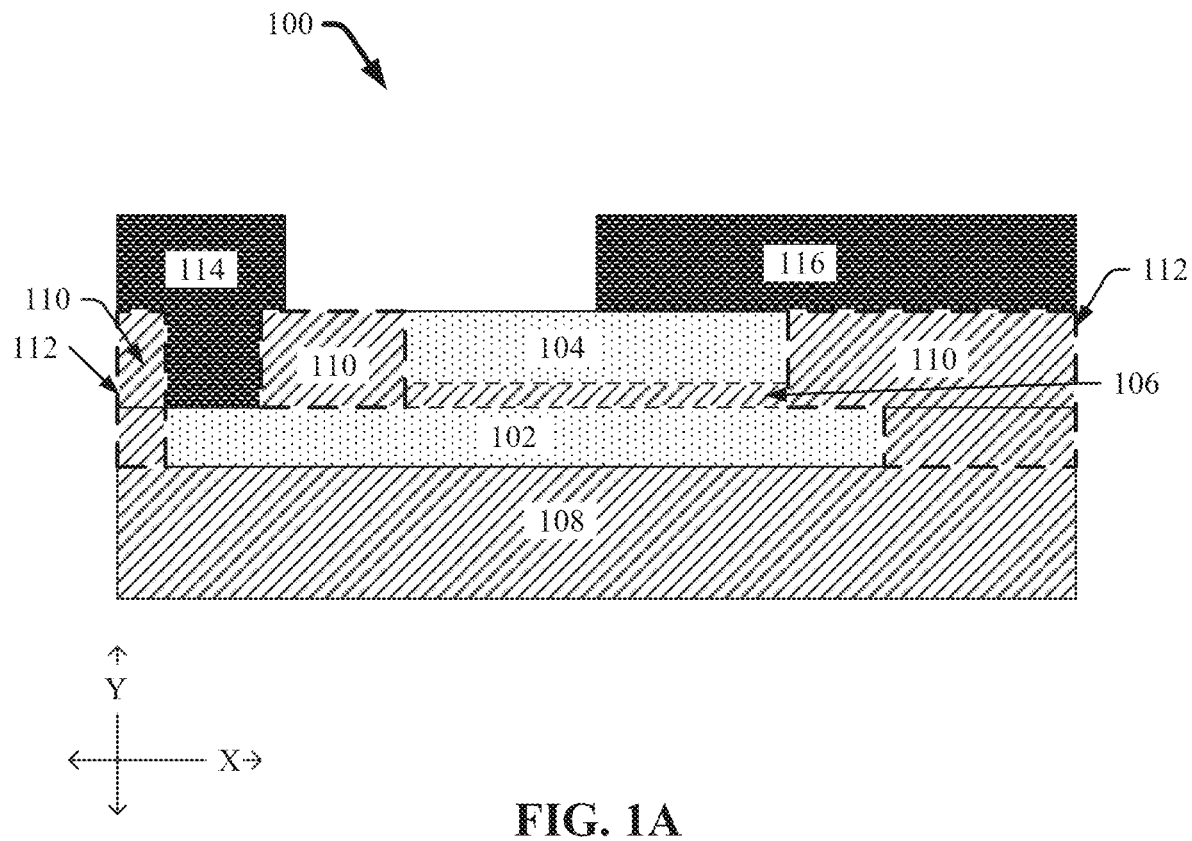
FIG. 1A illustrates a diagram of an example, non-limiting cross-sectional view of an apparatus comprising a silicon-based Josephson junction that can be oriented in a vertical stack in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. Additionally, features depicted in the drawings with like shading, cross-hatching, and/or coloring can comprise shared compositions and/or materials.

Josephson junctions have been used to manufacture qubits (e.g., superconducting qubits) in order to increase coherence times exhibited by quantum computing devices. However, the theoretical coherence times associated with Josephson junctions are often less than actually exhibited by the qubit. Material composition of the Josephson junction can affect the coherence times. For example, the type of superconducting material utilized, impurities in the superconducting material, and/or defects introduced by the manufacturing processes related to the superconducting material can adversely affect coherence times exhibited by Josephson junction qubits. For instance, aluminum-based Josephson junctions can exhibit longer coherence times than niobium-based Josephson junctions, but can still experience decoherence caused by defects commonly introduced during the manufacturing and/or deposition of the aluminum and/or aluminum derivatives (e.g., aluminum oxide defects).

Various embodiments described herein can regard apparatuses and/or methods for manufacturing silicon-based Josephson junctions for incorporation into one or more qubit devices. For example, one or more embodiments can regard Josephson junctions comprising silicon materials that can be crystalline, such as doped superconducting silicon electrodes, with single crystal undoped silicon serving as the junction. By using silicon materials, chemical purification, crystal growth, and/or defect control can be achieved in the various embodiments described herein while implementing complementary metal-oxide-semiconductor ("CMOS") technology. In one or more embodiments, the silicon-based Josephson junction can comprise a silicon dielectric material as the tunnel barrier to two superconducting silicon electrodes. Further, one or more embodiments can include orienting the silicon-based Josephson junction structure in a vertical orientation. Additionally, in various embodiments electrical isolation of the Josephson junction can be achieved via intrinsic silicon and/or incorporation of one or more isolation implants within silicon.

As described herein the term "superconducting" can characterize a material that exhibits superconducting properties at or below a superconducting critical temperature. Also, as described herein, the terms "deposition process" and/or "deposition processes" can refer to any process that grows, coats, deposits, and/or otherwise transfers one or more first materials onto one or more second materials. Example deposition processes can include, but are not limited to: physical vapor deposition ("PVD"), chemical vaper deposition ("CVD"), electrochemical deposition ("ECD"), atomic layer deposition ("ALD"), low-pressure chemical vapor deposition ("LPCVD"), plasma enhanced chemical vapor deposition ("PECVD"), high density plasma chemical vapor deposition ("HDPCVD"), sub-atmospheric chemical vapor deposition ("SACVD"), rapid thermal chemical vapor deposition ("RTCVD"), in-situ radical assisted deposition, high temperature oxide deposition ("HTO"), low temperature oxide deposition ("LTO"), limited reaction processing CVD ("LRPCVD"), ultrahigh vacuum chemical vapor deposition ("UHVCVD"), metalorganic chemical vapor deposition ("MOCVD"), physical vapor deposition ("PVD"), chemical oxidation, sputtering, plating, evaporation, spin-on-coating, ion beam deposition, electron beam deposition, laser assisted deposition, chemical solution deposition, a combination thereof, and/or the like.

As described herein, the terms "epitaxial growth process" and/or "epitaxial growth processes" can refer to any process that grows an epitaxial material (e.g., a crystalline semiconductor material) on a deposition surface of another semiconductor material in which the epitaxial material being grown has substantially the same crystalline characteristics as the semiconductor material of the deposition surface. In an epitaxial deposition process, chemical reactants provided by source gases (e.g., a silicon and/or germanium containing gas) and/or source liquids can be controlled, and the system parameters can be set, so that the depositing atoms arrive at the deposition surface with sufficient energy to move about on the surface and orient themselves to the crystal arrangement of the atoms of the deposition surface. Therefore, the grown epitaxial material has substantially the same crystalline characteristics as the deposition surface on which the epitaxial material is formed. For example, an epitaxially grown semiconductor material deposited on a <100> orientated crystalline surface can take on a <100> orientation. Example epitaxial growth processes can include, but are not limited to: vapor-phase epitaxy ("VPE"), molecular-beam epitaxy ("MBE"), liquid-phase epitaxy ("LPE"), a combination thereof, and/or the like.

As described herein, the terms "etching process", "etching processes", "removal process", and/or "removal processes" can refer to any process that removes one or more first materials from one or more second materials. Example etching and/or removal processes can include, but are not limited to: wet etching, dry etching (e.g., reactive ion etching ("RIE")), chemical-mechanical planarization ("CMP"), a combination thereof, and/or the like.

As described herein, the term "laser doping process" and/or "laser doping processes" can refer to one or more gas immersion laser doping techniques that can achieve homogeneous doped layers of silicon with varied active concentrations and/or thicknesses. Laser doping processes can be performed in an ultra-high vacuum ("UHV") chamber, wherein a precursor gas (e.g., boron trichloride) can be injected into the chamber and onto a surface of the silicon material (e.g., thereby saturating one or more chemisorption sites of the silicon material). Subsequently, the silicon material can be melted using a pulse laser (e.g., a pulsed excimer XeCl laser) to heat the silicon material for a define duration of time. One or more dopants (e.g., boron, gallium, and/or germanium) from the precursor gas can diffuse into the silicon material and be incorporated substitutionally. Thereby, a silicon-dopant (e.g., silicon-boron (Si:B), silicon-germanium (Si:Ge) and/or silicon-gallium (Si:Ga)) crystal can be grown on the underlying silicon via one or more epitaxial growth processes.

Figure 1B:
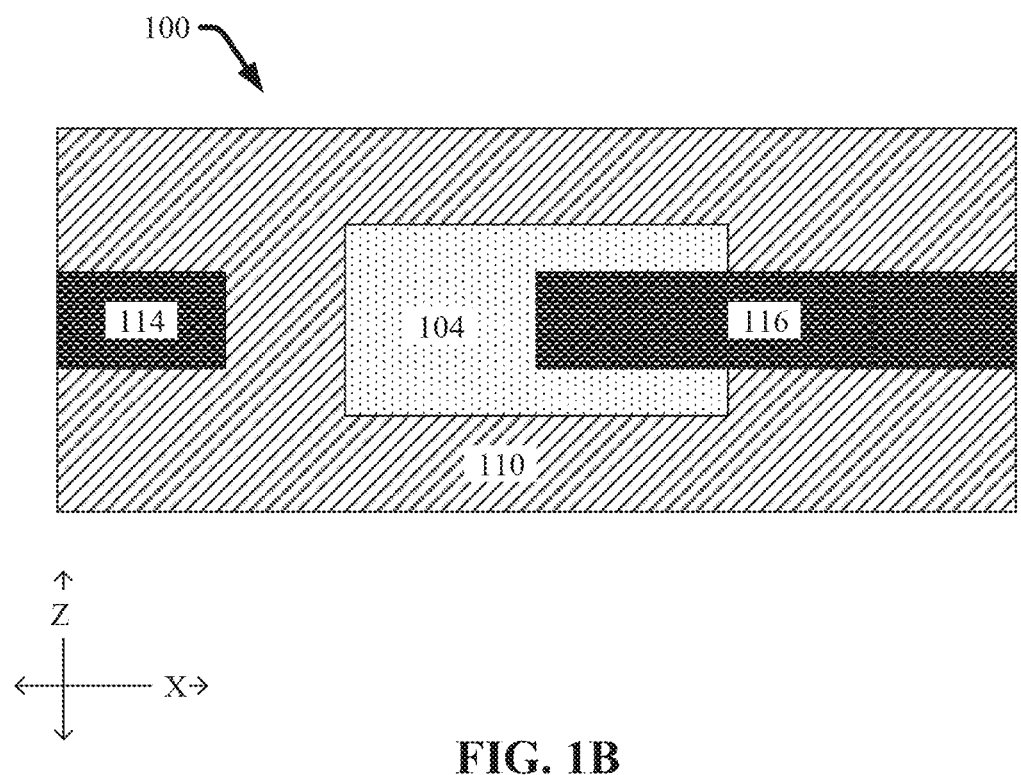
FIG. 1B illustrates a diagram of an example, non-limiting top-down view of an apparatus comprising a silicon-based Josephson junction that can be oriented in a vertical stack in accordance with one or more embodiments described herein.

FIGS. 1A and/or 1B illustrate diagrams of an example, non-limiting qubit device 100 that can comprise a silicon-based Josephson junction that can include a first superconducting silicon electrode 102, a second superconducting silicon electrode 104, and/or a tunnel barrier 106 in accordance with one or more embodiments described herein. FIG. 1A depicts a cross-sectional view of the qubit device 100, and FIG. 1B depicts a top-down view of the qubit device 100. Repetitive description of like elements employed in other embodiments described herein is omitted for sake of brevity.

As shown in FIG. 1A, the silicon-based Josephson junction can be positioned on a semiconductor substrate 108. Further, the first superconducting silicon electrode 102, second superconducting silicon electrode 104, and/or dielectric tunnel barrier 106 can be stacked on the semiconductor substrate 108 in a vertical orientation (e.g., along the "Y" axis). Additionally, at least a portion of the semiconductor substrate 108 and one or more isolation layers 110 can form an isolation region 112 (e.g., delineated by bold dashed lines) adjacent to the silicon-based Josephson junction. Additionally, the silicon-based Josephson junction can comprise a first metal contact 114 operably coupled to the first superconducting silicon electrode 102, and/or a second metal contact 116 operably coupled to a second superconducting silicon electrode 104.

The semiconductor substrate 108 can be crystalline, semi-crystalline, microcrystalline, or amorphous. The semiconductor substrate 108 can comprise essentially (e.g., except for contaminants) a single element (e.g., silicon or germanium) and/or a compound (e.g., aluminum oxide, silicon dioxide, gallium arsenide, silicon carbide, silicon germanium, a combination thereof, and/or the like. The semiconductor substrate 110 can also have multiple material layers, such as, but not limited to: a semiconductor-on-insulator substrate ("SeOI"), a silicon-on-insulator substrate ("SOI"), germanium-on-insulator substrate ("GeOI"), silicon-germanium-on-insulator substrate ("SGOI"), a combination thereof, and/or the like. Additionally, the semiconductor substrate 110 can also have other layers, such as oxides with high dielectric constants ("high-K oxides") and/or nitrides. In one or more embodiments, the semiconductor substrate 110 can be a silicon wafer. In various embodiments, the semiconductor substrate 110 can comprise a single crystal silicon (Si), silicon-germanium (e.g., characterized by the chemical formula SiGe), a Group III-V semiconductor wafer or surface/active layer, a combination thereof, and/or the like.

In one or more embodiments, at least a top portion of the semiconductor substrate 108 can provide structural support to the silicon-based Josephson junction and/or qubit device 100 (e.g., as shown in FIGS. 1A and/or 1B). In various embodiments, at least the top portion of the semiconductor substrate 108 can comprise intrinsic silicon. In some embodiments, at least the top portion of the semiconductor substrate 108 can comprise silicon-germanium (SiGe).

The first superconducting silicon electrode 102 can comprise a laser doped crystalline silicon material. For example, one or more dopants can be incorporated into a portion of silicon material via one or more laser doping processes to facilitate superconductivity. Example dopants that can be comprised within the first superconducting silicon electrode 102 can include, but are not limited to: boron, gallium, germanium, a combination thereof, and/or the like. In one or more embodiments, the first superconducting silicon electrode 102 can have an active concentration of the dopant ranging from, for example, greater than or equal to 4 atomic percent (At %) and less than or equal to 40 At % (e.g., at least 4 at % to 11 At % where the first superconducting electrode 102 comprises a boron dopant, and/or at least 10 At % to 40 At % where the first superconducting electrode 102 comprises a gallium dopant). In various embodiments, the critical temperature of the first superconducting electrode 102 can range from, for example, greater than or equal to 500 milli-Kelvin (mK) and less than or equal to 6 K(e.g., 500 mK to 600 mK where the first superconducting electrode 102 comprises a boron dopant, and/or 5K to 6K where the first superconducting electrode 102 comprises a gallium dopant).

One of ordinary skill in the art will recognize that the length of the first superconducting silicon electrode 102 (e.g., along the "X" axis) can vary depending on the function of the silicon-based Josephson junction and/or the structure of a qubit device 100. For example, the length of the first superconducting silicon electrode 102 (e.g., along the "X" axis) can be greater than or equal to 100 nanometers (nm) and less than or equal to hundreds of microns (e.g., 500 nm to 1,000 nm). Similarly, the thickness of the first superconducting silicon electrode 102 (e.g., along the "Y" axis) can vary depending on the function of the silicon-based Josephson junction and/or the structure of a qubit device 100. For example, the thickness of the first superconducting silicon electrode 102 (e.g., along the "Y" axis) can be greater than or equal to 5 nm and less than or equal to 500 nm (e.g., 10 nm to 50 nm). Additionally, in one or more embodiments, the first superconducting silicon electrode 102 can be embedded within the semiconductor substrate 108 (e.g., as shown in FIG. 1A).

In one or more embodiments, the tunnel barrier 106, one or more isolation layers 110, and/or first metal contact can be positioned above (e.g., directly above) the first superconducting silicon electrode 102. The tunnel barrier 106 is delineated in FIG. 1A by dashed lines. In various embodiments, the tunnel barrier 106 can comprise a dielectric material so as to render the silicon-based Josephson junction a superconductor-insulator-superconductor ("SIS") Josephson junction. For example, the tunnel barrier 106 can comprise an intrinsic silicon material. In one or more embodiments, the tunnel barrier 106 can comprise doped silicon so as to render the silicon-based Josephson junction a superconductor-normal-superconductor ("SNS") Josephson junction. For example, one or more dopants that can be comprised within the tunnel barrier 106 can include, but are not limited to: phosphorus (P), arsenic (As), a combination thereof, and/or the like. One of ordinary skill in the art will recognize that the length of the tunnel barrier 106 (e.g., along the "X" axis) can vary depending on the function of the silicon-based Josephson junction and/or qubit device 100. For example, the length of the tunnel barrier 106 (e.g., along the "X" axis) can be greater than or equal to 30 nm and less than or equal to 1,000 nm (e.g., 100 nm to 300 nm). Similarly, the thickness of the tunnel barrier 106 (e.g., along the "Y" axis) can vary depending on the function of the silicon-based Josephson junction and/or qubit device 100. For example, the thickness of the tunnel barrier 106 (e.g., along the "Y" axis) can be greater than or equal to 0.5 nm and less than or equal to 300 nm.

The second superconducting silicon electrode 104 can be positioned on the tunnel barrier 106 such that the tunnel barrier 106 is located between the first superconducting silicon electrode 102 and the second superconducting silicon electrode 104. In one or more embodiments, the second superconducting silicon electrode 104 can comprise the same, or substantially the same, composition as the first superconducting silicon electrode 102. Alternatively, in one or more embodiments the second superconducting silicon electrode 104 can comprise a different composition than the first superconducting silicon electrode 102.

For example, the second superconducting silicon electrode 104 can comprise a laser doped crystalline silicon material. For instance, one or more dopants can be incorporated into a portion of silicon material via one or more laser doping processes to facilitate superconductivity. Example dopants that can be comprised within the second superconducting silicon electrode 104 can include, but are not limited to: boron, gallium, a combination thereof, and/or the like. In one or more embodiments, the second superconducting silicon electrode 104 can have an active concentration of the dopant ranging from, for example, greater than or equal to 4 At % and less than or equal to 40 At % (e.g., at least 4 at % to 11 At % where the first superconducting electrode 102 comprises a boron dopant, and/or at least 10 At % to 40 At % where the first superconducting electrode 102 comprises a gallium dopant). In various embodiments, the critical temperature of the second superconducting silicon electrode 104 can range from, for example, greater than or equal to 500 mK and less than or equal to 6 K (e.g., 500 mK to 600 mK where the second superconducting electrode 104 comprises a boron dopant, and/or 5K to 6K where the second superconducting electrode 104 comprises a gallium dopant).

One of ordinary skill in the art will recognize that the length of the second superconducting silicon electrode 104 (e.g., along the "X" axis) can vary depending on the function of the silicon-based Josephson junction and/or the qubit device 100. For example, the length of the second superconducting silicon electrode 104 (e.g., along the "X" axis) can be greater than or equal to 10 nm and less than or equal to hundreds of microns (e.g., 500 nm to 1,000 nm). Similarly, the thickness of the second superconducting silicon electrode 104 (e.g., along the "Y" axis) can vary depending on the function of the silicon-based Josephson junction and/or the qubit device 100. For example, the thickness of the second superconducting silicon electrode 104 (e.g., along the "Y" axis) can be greater than or equal to 5 nm and less than or equal to 500 nm (e.g., 10 nm to 50 nm).

In one or more embodiments, the one or more isolation layers 110 can be adjacent to the first superconducting silicon electrode 102, tunnel barrier 106, and/or second superconducting silicon electrode 104. The one or more isolation layers 110 can comprise one or more insulator materials, and/or can electrically isolate the silicon-based Josephson junction from adjacent hardware and/or devices (e.g., adjacent qubit devices 100). In various embodiments, the one or more isolation layers 110 can comprise intrinsic silicon, and/or can be deposited within the same manufacturing step as the tunnel barrier 106. The one or more isolation layers 110 and/or at least a portion of the semiconductor substrate 108 can define an isolation region 112 (e.g., delineated in FIG. 1A by bold dashed lines). As shown in FIG. 1A, in one or more embodiments the semiconductor substrate 108, tunnel barrier 106, and/or isolation layers 110 can comprise the same, or substantially the same, material (e.g., intrinsic silicon).

As shown in FIG. 1A, the first metal contact 114 and/or the second metal contact 116 can be positioned adjacent to the isolation region 112 (e.g., on top of the isolation region 112 wherein the first superconducting silicon electrode 102, tunnel barrier 106, and/or second superconducting silicon electrode 104 are arranged in a stacked vertical orientation). The second metal contact 116 can be operably coupled to (e.g., directly in contact with) the second superconducting silicon electrode 104. Further, the first metal contact 114 can extend through what would otherwise be a part of the isolation region 112 to be operably coupled to the first superconducting silicon electrode 102. The first metal contact 114 and/or the second metal contact 116 can comprise an electrically conductive superconductor, such as, but not limited to: aluminum (Al), niobium (Nb), tantalum (Ta), tantalum nitride (TaN), titanium nitride (TiN), vanadium (V), tin (Sb), lead (Pb), a combination thereof, and/or the like.

FIG. 1B depicts a top-down view of the qubit device 100 shown in FIG. 1A, and/or illustrates exemplary positioning and/or structural configurations of one or more of the features of the qubit device 100 along the "Z" axis. Although FIGS. 1A and/or 1B depict a qubit device comprising a single Josephson junction positioned on the semiconductor substrate 108, the architecture of the qubit device 100 is not so limited. For example, qubit devices 100 comprising a plurality of Josephson junctions (e.g., a plurality of first superconducting silicon electrodes 102, tunnel barriers 106, and/or second superconducting silicon electrodes 104) are also envisaged. For instance, one or more qubit devices 100 can comprise a plurality of Josephson junctions comprising the features described herein (e.g., depicted in FIGS. 1A and/or 1B) and positioned adjacent to each other on the semiconductor substrate 108.

Figure 2:
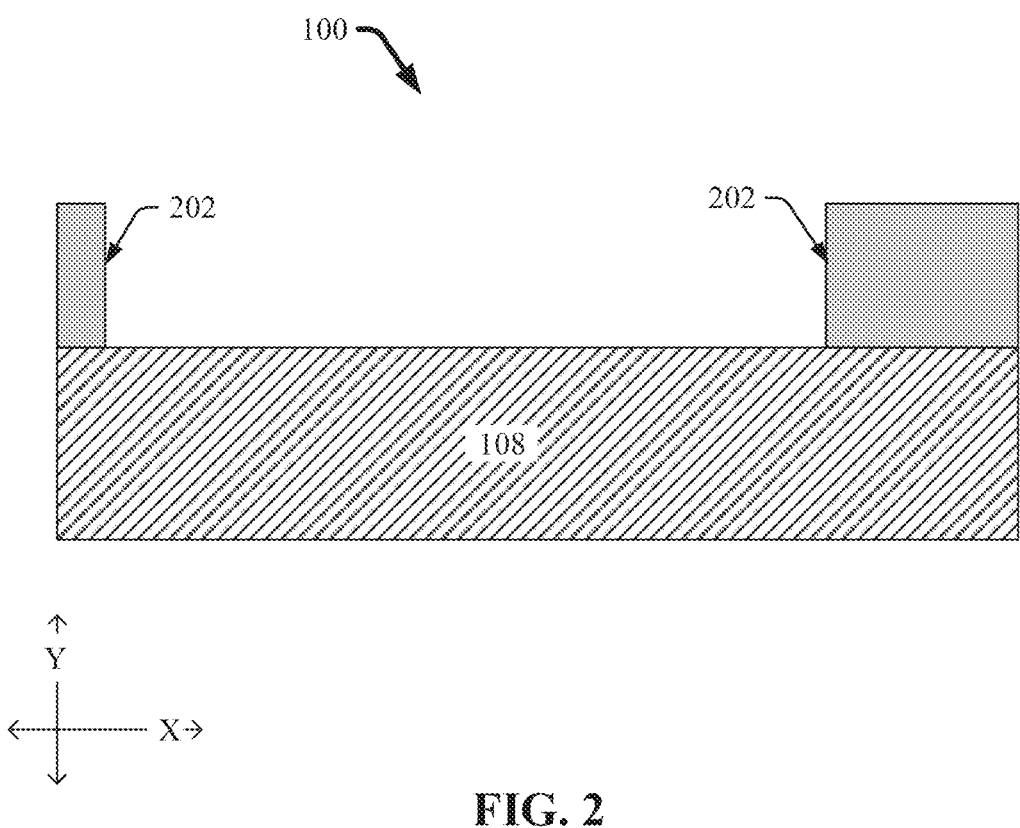
FIG. 2 illustrates a diagram of an example, non-limiting cross-sectional view of an apparatus comprising a silicon-based Josephson junction during a first stage of manufacturing in accordance with one or more embodiments described herein.

FIG. 2 illustrates a diagram of the example, non-limiting qubit device 100 during a first stage of manufacturing in accordance with one or more embodiments described herein. Repetitive description of like elements employed in other embodiments described herein is omitted for sake of brevity. During the first stage of manufacturing, one or more resist masks 202 can be deposited onto the semiconductor substrate 108 via one or more deposition processes. A thickness (e.g., along the "Y" axis) of the resist mask 202 can vary, ranging from, for example, greater than or equal to 100 and less than or equal to 1,000 nm (e.g., 100 nm to 300 nm). The exposed region of the semiconductor substrate 108 (e.g., not covered by the resist mask 202) can define one or more boundaries of the silicon-based Josephson junction.

Figure 3:
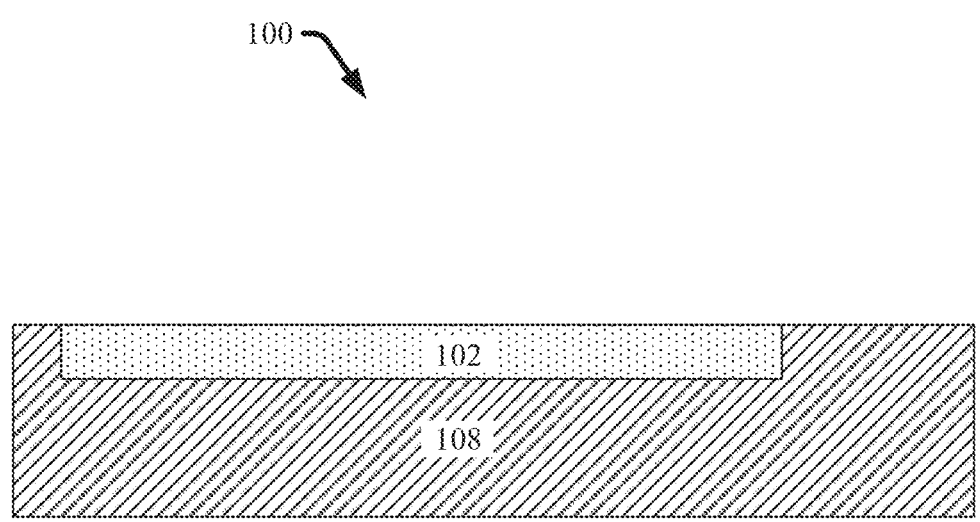
FIG. 3 illustrates a diagram of an example, non-limiting cross-sectional view of an apparatus comprising a silicon-based Josephson junction during a second stage of manufacturing in accordance with one or more embodiments described herein.
Figure 3:
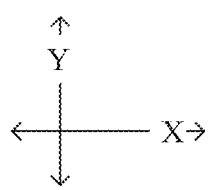

FIG. 3 illustrates a diagram of the example, non-limiting qubit device 100 during a second stage of manufacturing in accordance with one or more embodiments described herein. Repetitive description of like elements employed in other embodiments described herein is omitted for sake of brevity. During the second stage of manufacturing, the first superconducting silicon electrode 102 can be formed, and/or the resist mask 202 can be removed.

In one or more embodiments, the exposed region of the semiconductor substrate 108 (e.g., not covered by the resist mask 202) can be subject to one or more laser doping processes to form the first superconducting silicon electrode 102. For example, the exposed region can be subject to one or more laser doping processes to implant a boron dopant and form the first superconducting silicon electrode 102. In one or more embodiments, the first superconducting silicon electrode 102 can be formed by etching a trench into the exposed region of the semiconductor substrate 108 (e.g., via one or more etching processes). Subsequently, an epitaxial silicon material, such as an epitaxial silicon-dopant material (e.g., Si:Ga, Si:Ge, and/or Ge), can be selectively deposited via one or more epitaxial growth processes into the trench. Wherein the first superconducting silicon electrode 102 is grown via one or more epitaxial growth processes, the thickness (e.g., along the "Y" axis) of the first superconducting silicon electrode 102 can be defined via one or more CMP processes. The resist mask 202 can be removed via one or more etching processes.

Figure 4:
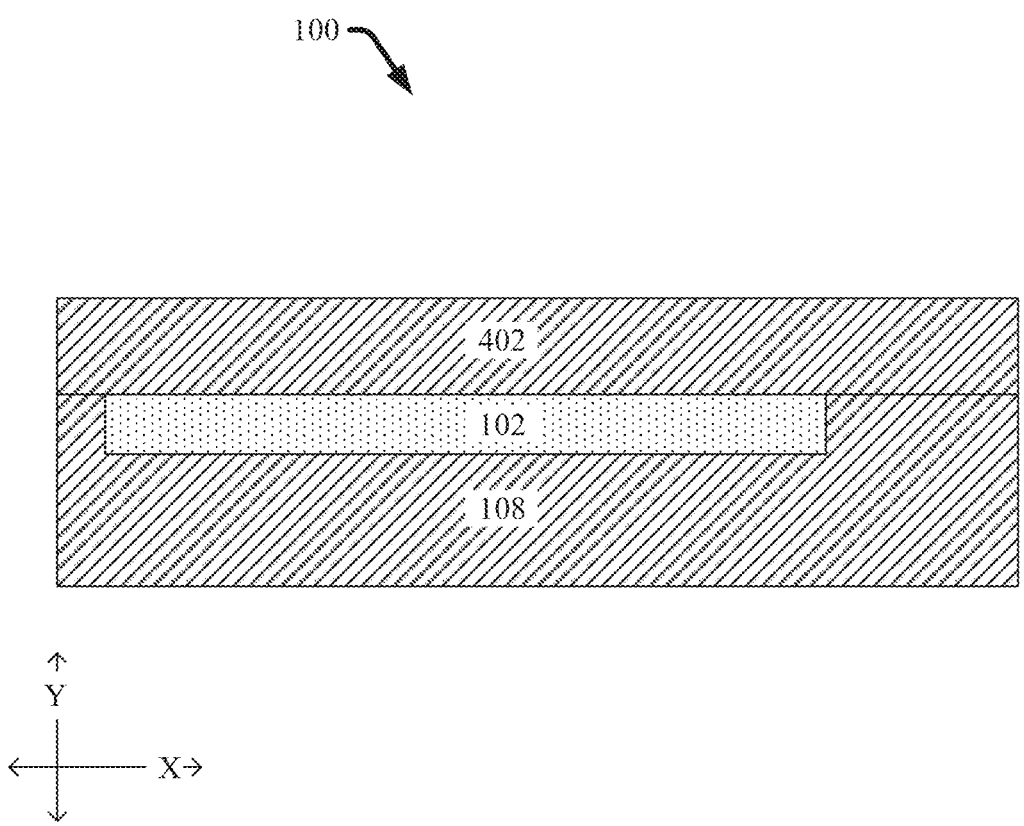
FIG. 4 illustrates a diagram of an example, non-limiting cross-sectional view of an apparatus comprising a silicon-based Josephson junction during a third stage of manufacturing in accordance with one or more embodiments described herein.

FIG. 4 illustrates a diagram of the example, non-limiting qubit device 100 during a third stage of manufacturing in accordance with one or more embodiments described herein. Repetitive description of like elements employed in other embodiments described herein is omitted for sake of brevity. During the third stage of manufacturing, one or more silicon layers 402 can be deposited onto the first superconducting electrode 102 and/or the semiconductor substrate 108 via one or more deposition processes and/or epitaxial growth processes. In one or more embodiments, the one or more silicon layers 402 can be deposited via one or more epitaxial growth processes at a low temperature (e.g., at a temperature less than 500 degrees Celsius (° C.) by, for instance, by molecular beam epitaxy ("MBE")).

In one or more embodiments, the one or more silicon layers 402 can subsequently form the tunnel barrier 106 and/or the one or more isolation layers 110. Thereby, the thickness (e.g., along of the "Y" axis) of the one or more silicon layers 402 can vary depending on the desired thickness of the tunnel barrier 106, one or more isolation layers 110, and/or second superconducting silicon electrode 104. For example, the thickness (e.g., along of the "Y" axis) of the one or more silicon layers 402 can range from greater than or equal to 5 nm and less than or equal to 500 nm (e.g., 20 nm to 50 nm).

Figure 5A:
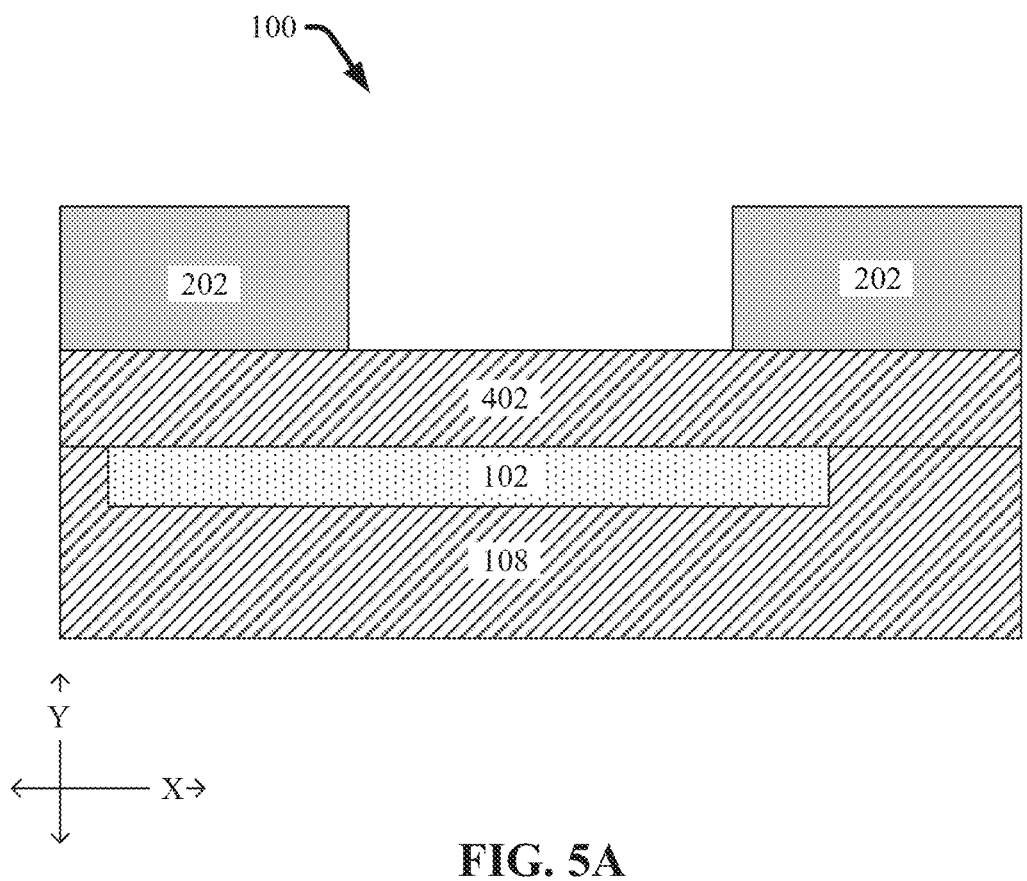
FIG. 5A illustrates a diagram of an example, non-limiting cross-sectional view of an apparatus comprising a silicon-based Josephson junction during a fourth stage of manufacturing in accordance with one or more embodiments described herein.
Figure 5B:
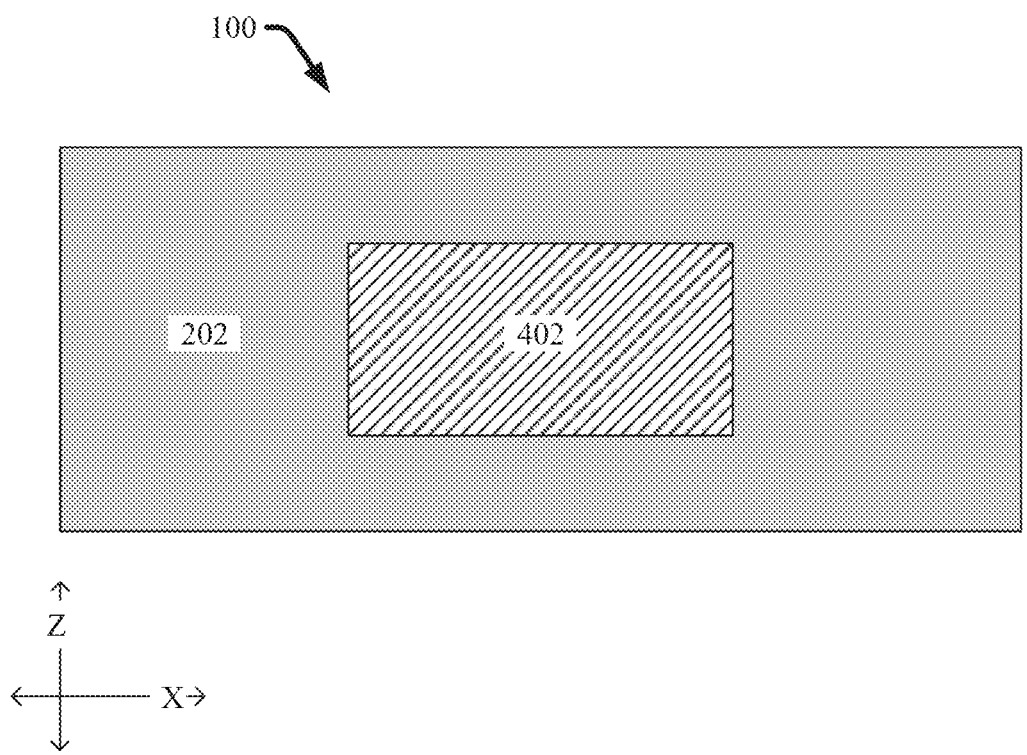
FIG. 5B illustrates a diagram of an example, non-limiting top-down view of an apparatus comprising a silicon-based Josephson junction during a fourth stage of manufacturing in accordance with one or more embodiments described herein.

FIGS. 5A and/or 5B illustrate diagrams of the example, non-limiting qubit device 100 during a fourth stage of manufacturing in accordance with one or more embodiments described herein. Repetitive description of like elements employed in other embodiments described herein is omitted for sake of brevity. FIG. 5A depicts a cross-sectional view of the qubit device 100 during the fourth stage of manufacturing, and/or FIG. 5B depicts a top-down view of the qubit device 100 during the fourth stage of manufacturing. During the fourth stage of manufacturing, one or more resist masks 202 can be deposited onto the one or more silicon layers 402 via one or more deposition processes. The exposed region of the one or more silicon layers 402 (e.g., not covered by the resist mask 202) can define one or more boundaries of the second superconducting silicon electrode 104.

Figure 6A:
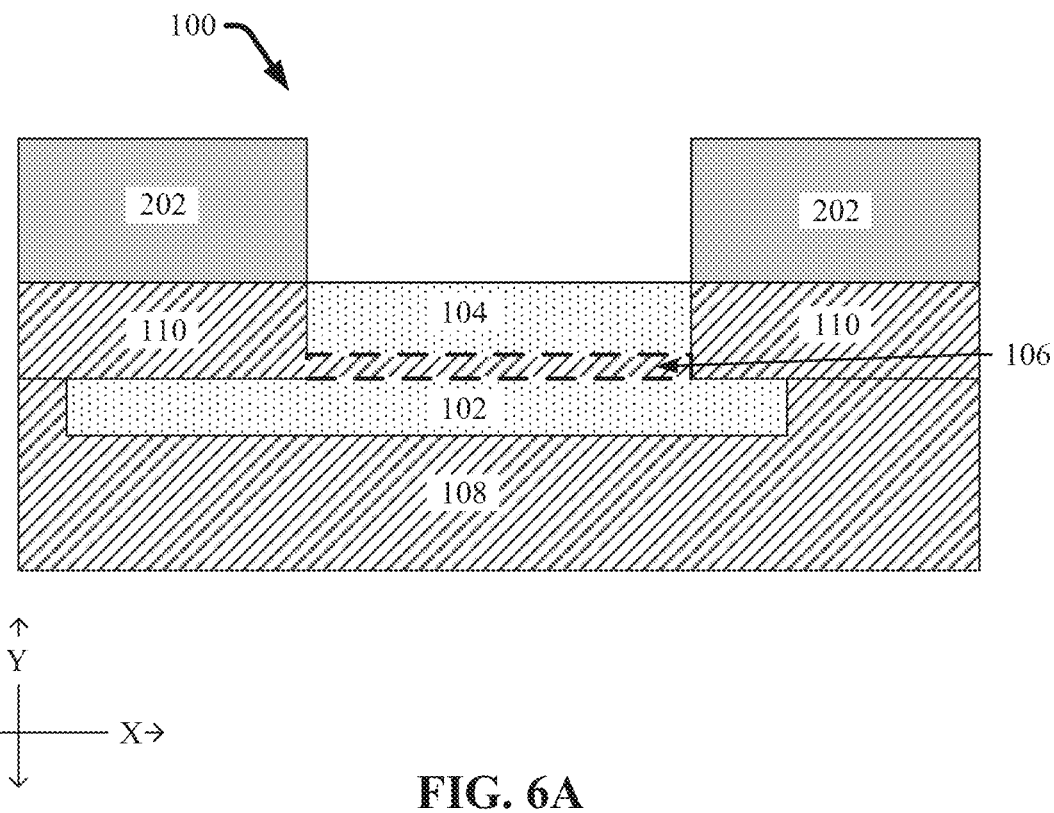
FIG. 6A illustrates a diagram of an example, non-limiting cross-sectional view of an apparatus comprising a silicon-based Josephson junction during a fifth stage of manufacturing in accordance with one or more embodiments described herein.
Figure 6B:
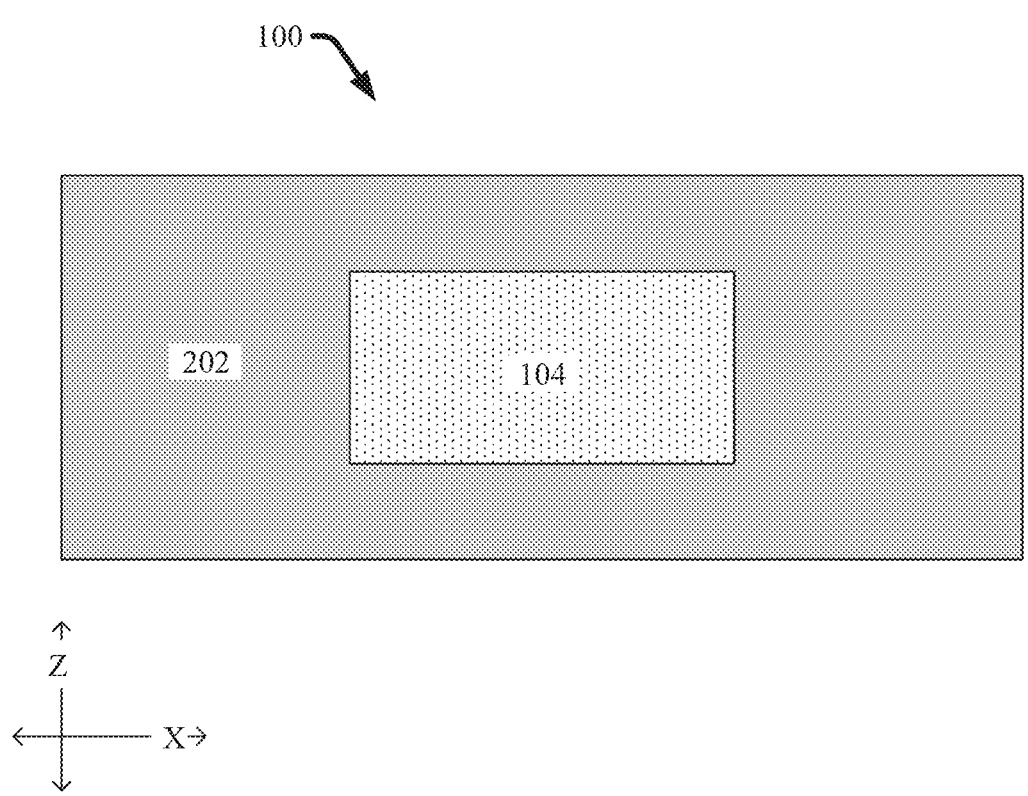
FIG. 6B illustrates a diagram of an example, non-limiting top-down view of an apparatus comprising a silicon-based Josephson junction during a fifth stage of manufacturing in accordance with one or more embodiments described herein.

FIGS. 6A and/or 6B illustrate diagrams of the example, non-limiting qubit device 100 during a fifth stage of manufacturing in accordance with one or more embodiments described herein. Repetitive description of like elements employed in other embodiments described herein is omitted for sake of brevity. FIG. 6A depicts a cross-sectional view of the qubit device 100 during the fifth stage of manufacturing, and/or FIG. 6B depicts a top-down view of the qubit device 100 during the fifth stage of manufacturing. During the fifth stage of manufacturing, the second superconducting silicon electrode 104 can be formed.

In one or more embodiments, the exposed region of the one or more silicon layers 402 (e.g., not covered by the resist mask 202) can be subject to one or more laser doping processes to form the second superconducting silicon electrode 104. For example, the exposed region can be subject to one or more laser doping processes to implant a dopant (e.g., boron) and form the second superconducting silicon electrode 104. In one or more embodiments, the second superconducting silicon electrode 104 can be formed by etching a trench into the exposed region of the one or more silicon layers 402 (e.g., via one or more etching processes). Subsequently, an epitaxial silicon material, such as an epitaxial silicon-dopant material (e.g., Si:Ga, Si:Ge, and/or Ge), can be selectively deposited via one or more epitaxial growth processes into the trench. Wherein the second superconducting silicon electrode 104 is grown via one or more epitaxial growth processes, the thickness (e.g., along the "Y" axis) of the second superconducting silicon electrode 104 can be defined via one or more CMP processes.

The formation of the second superconducting silicon electrode 104 can thereby define the tunnel barrier 106 and/or one or more isolation layers 110 from the remaining portions of the one or more silicon layers 402. For example, the portion of the one or more silicon layers 402 remaining between the first superconducting silicon electrode 102 and the second superconducting silicon electrode 104 can be the tunnel barrier 106. For instance, the tunnel barrier 106 can comprise intrinsic silicon (e.g., which can serve as a dielectric at a critical temperature of about 20 mK). Additionally, portions of the one or more silicon layers 402 remaining adjacent to the second superconducting silicon electrode 104 and tunnel barrier 106 can be the one or more isolation layers 110.

In one or more embodiments, the remaining portion of the silicon layers 402 that can become the tunnel barrier 106 can be doped (e.g., with P, As, and/or the like) so as to form a normal metal tunnel barrier 106. For example, the remaining portion of the silicon layers 402 that can become the tunnel barrier 106 can be doped prior to the epitaxial growth process that can form the second superconducting silicon electrode 104.

Figure 7A:
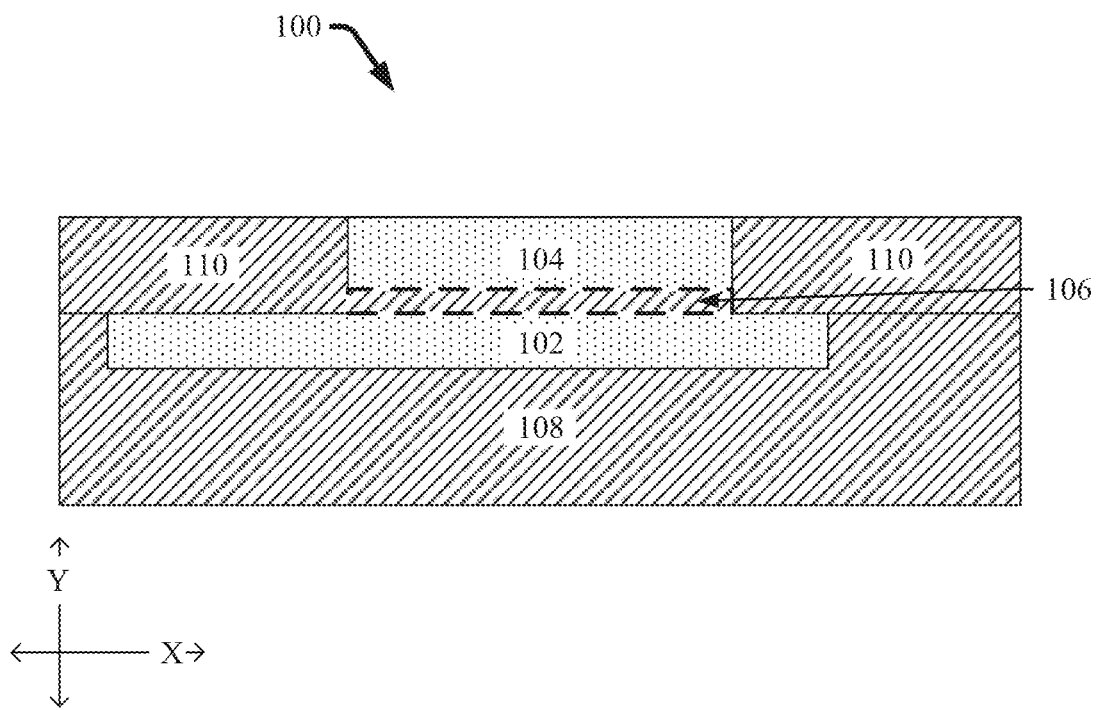
FIG. 7A illustrates a diagram of an example, non-limiting cross-sectional view of an apparatus comprising a silicon-based Josephson junction during a sixth stage of manufacturing in accordance with one or more embodiments described herein.
Figure 7B:
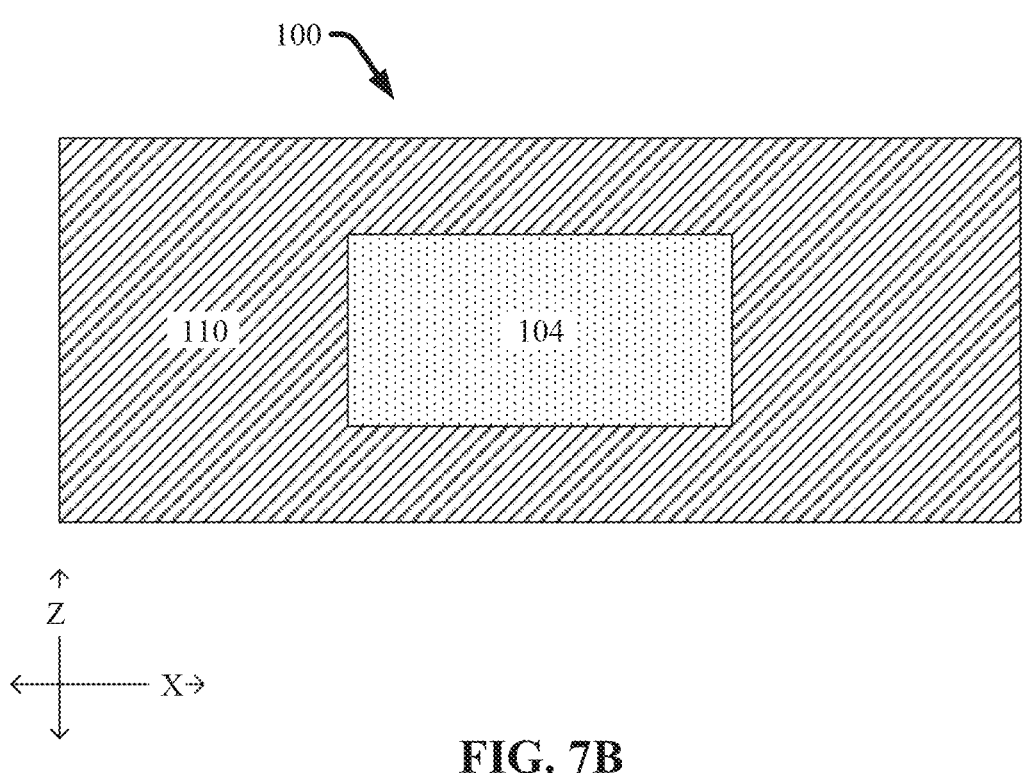
FIG. 7B illustrates a diagram of an example, non-limiting top-down view of an apparatus comprising a silicon-based Josephson junction during a sixth stage of manufacturing in accordance with one or more embodiments described herein.

FIGS. 7A and/or 7B illustrate diagrams of the example, non-limiting qubit device 100 during a sixth stage of manufacturing in accordance with one or more embodiments described herein. Repetitive description of like elements employed in other embodiments described herein is omitted for sake of brevity. FIG. 7A depicts a cross-sectional view of the qubit device 100 during the sixth stage of manufacturing, and/or FIG. 7B depicts a top-down view of the qubit device 100 during the sixth stage of manufacturing. During the sixth stage of manufacturing, the one or more resist masks 202 can be removed from the one or more isolation layers 110 via one or more etching processes.

Figure 8A:
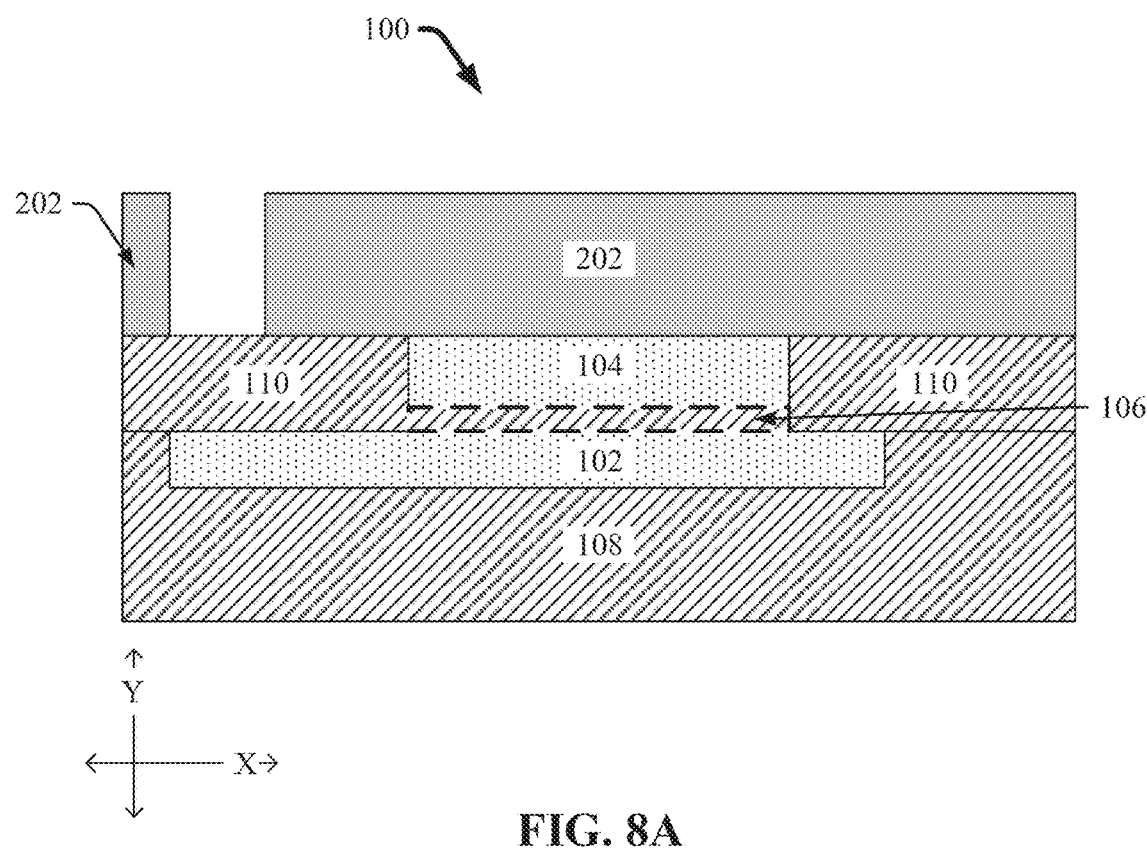
FIG. 8A illustrates a diagram of an example, non-limiting cross-sectional view of an apparatus comprising a silicon-based Josephson junction during a seventh stage of manufacturing in accordance with one or more embodiments described herein.
Figure 8B:
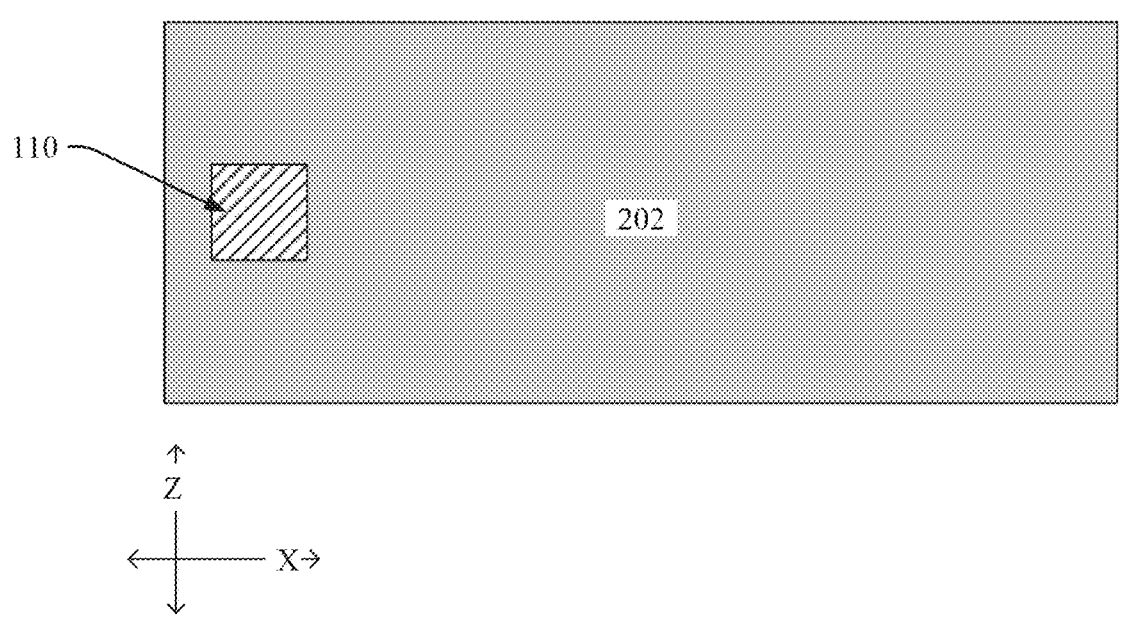
FIG. 8B illustrates a diagram of an example, non-limiting top-down view of an apparatus comprising a silicon-based Josephson junction during a seventh stage of manufacturing in accordance with one or more embodiments described herein.

FIGS. 8A and/or 8B illustrate diagrams of the example, non-limiting qubit device 100 during a seventh stage of manufacturing in accordance with one or more embodiments described herein. Repetitive description of like elements employed in other embodiments described herein is omitted for sake of brevity. FIG. 8A depicts a cross-sectional view of the qubit device 100 during the seventh stage of manufacturing, and/or FIG. 8B depicts a top-down view of the qubit device 100 during the seventh stage of manufacturing.

During the seventh stage of manufacturing, one or more resist masks 202 can be deposited onto the one or more isolation layers 110 and/or second superconducting silicon electrode 104 via one or more deposition processes. As shown in FIGS. 8A and/or 8B, the resist mask 202 can be deposited so as to leave a portion of the one or more isolation layers 110 exposed. Further, the exposed portion of the one or more isolation layers 110 (e.g., the portion not covered by resist mask 202) can be aligned with a portion of the first superconducting silicon electrode 102 along the "Y" axis (e.g., as shown in FIG. 8A).

Figure 9A:
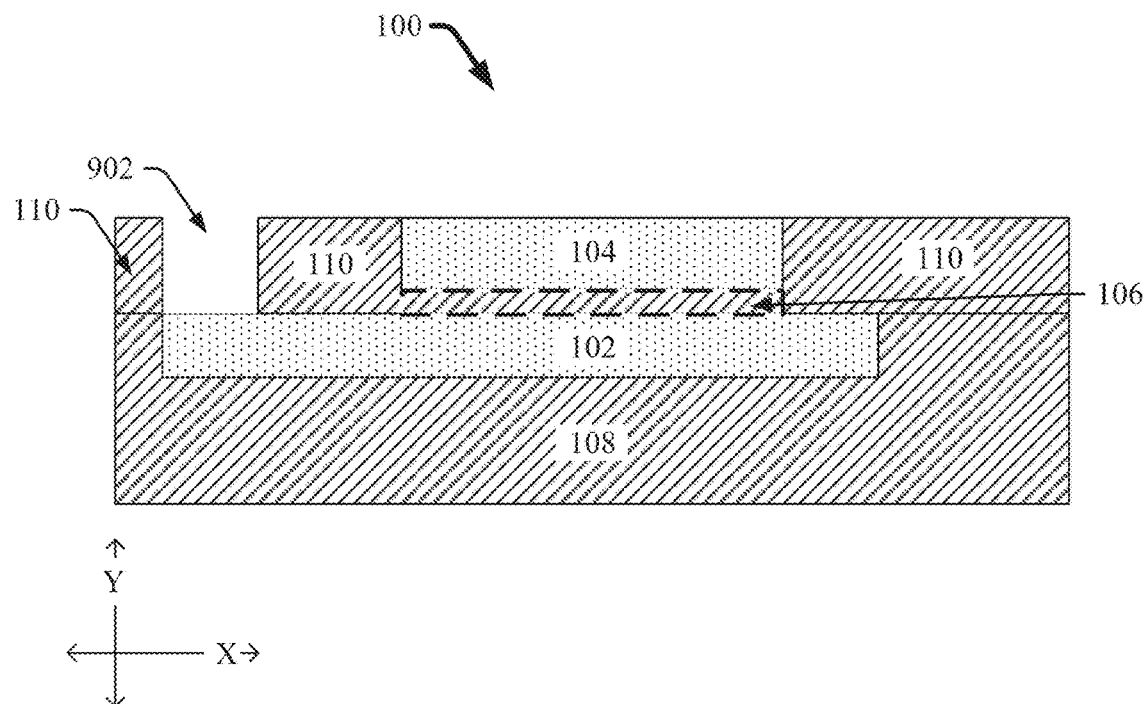
FIG. 9A illustrates a diagram of an example, non-limiting cross-sectional view of an apparatus comprising a silicon-based Josephson junction during an eighth stage of manufacturing in accordance with one or more embodiments described herein.
Figure 9B:
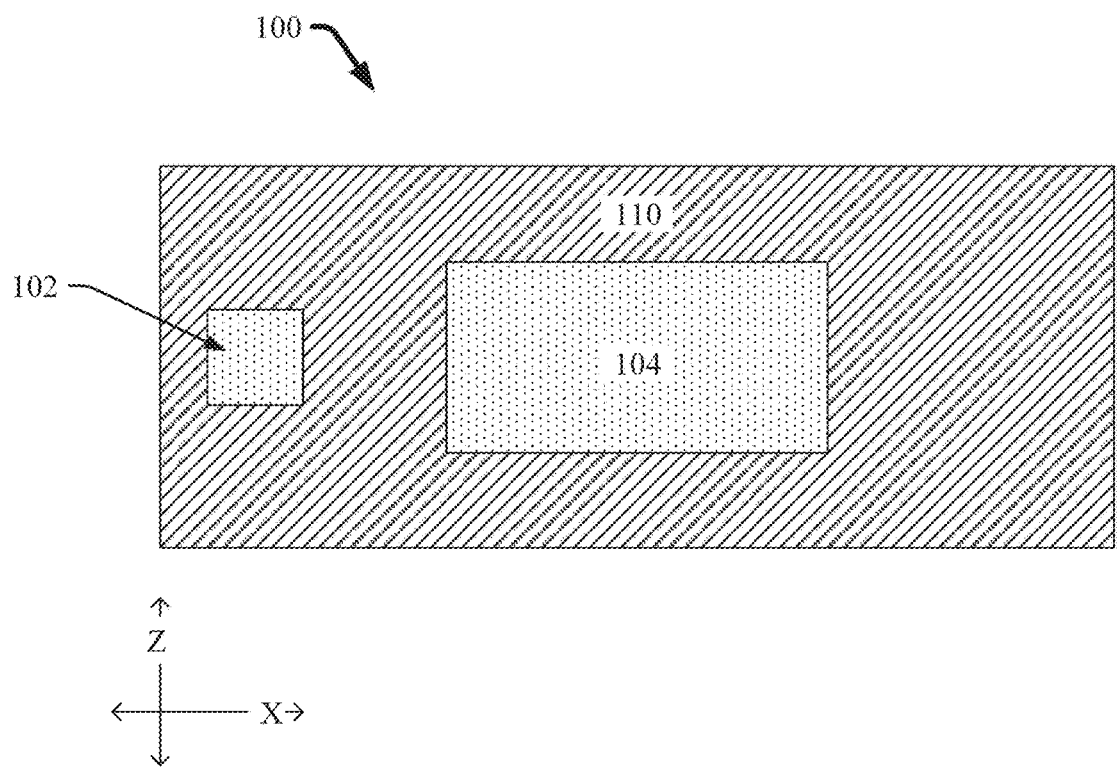
FIG. 9B illustrates a diagram of an example, non-limiting top-down view of an apparatus comprising a silicon-based Josephson junction during an eighth stage of manufacturing in accordance with one or more embodiments described herein.

FIGS. 9A and/or 9B illustrate diagrams of the example, non-limiting qubit device 100 during an eighth stage of manufacturing in accordance with one or more embodiments described herein. Repetitive description of like elements employed in other embodiments described herein is omitted for sake of brevity. FIG. 9A depicts a cross-sectional view of the qubit device 100 during the eighth stage of manufacturing, and/or FIG. 9B depicts a top-down view of the qubit device 100 during the eighth stage of manufacturing.

During the eighth stage of manufacturing, the exposed portion of the one or more isolation layers 110 can be etched away (e.g., via one or more etching processes, such as RIE) to form a contact hole 902 in the isolation layers 110 that can extend to the first superconducting silicon electrode 102. As shown in FIGS. 9A and/or 9B, etching the contact hole 902 can expose a portion of the first superconducting silicon electrode 102 (e.g., by removing at least a portion of the isolation layers 110 previously covering the first superconducting silicon electrode 102). Subsequent to etching the contact hole 902, the one or more resist masks 202 can be removed (e.g., via one or more etching processes), and/or the exposed surfaces of the qubit device 100 can be cleaned (e.g., using DHF).

Figure 10A:
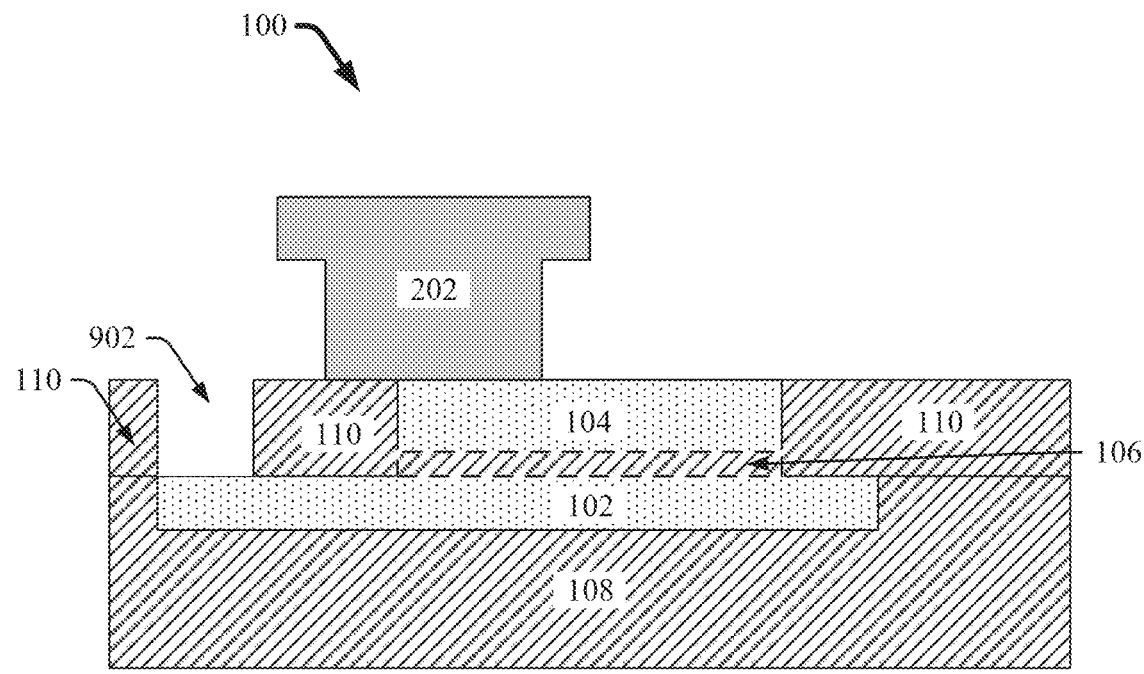
FIG. 10A illustrates a diagram of an example, non-limiting cross-sectional view of an apparatus comprising a silicon-based Josephson junction during a ninth stage of manufacturing in accordance with one or more embodiments described herein.
Figure 10B:
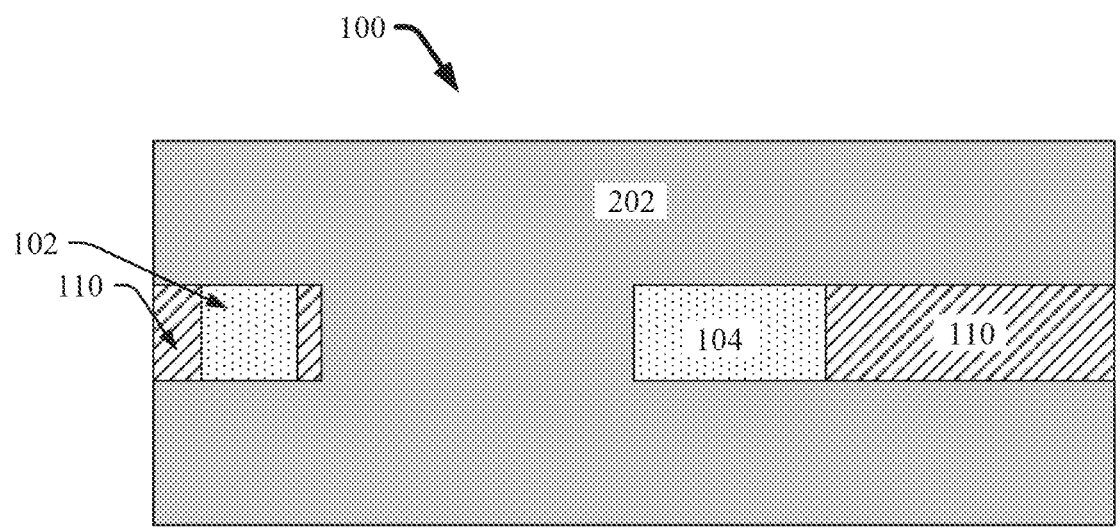
FIG. 10B illustrates a diagram of an example, non-limiting top-down view of an apparatus comprising a silicon-based Josephson junction during a ninth stage of manufacturing in accordance with one or more embodiments described herein.

FIGS. 10A and/or 10B illustrate diagrams of the example, non-limiting qubit device 100 during a ninth stage of manufacturing in accordance with one or more embodiments described herein. Repetitive description of like elements employed in other embodiments described herein is omitted for sake of brevity. FIG. 10A depicts a cross-sectional view of the qubit device 100 during the ninth stage of manufacturing, and/or FIG. 10B depicts a top-down view of the qubit device 100 during the ninth stage of manufacturing.

During the ninth stage of manufacturing, one or more resist masks 202 can be patterned onto the second superconducting silicon electrode 104 and/or isolation layers 110 (e.g., via one or more lift-off processes) to facilitate the formation of one or more metal contacts and/or the incorporation of one or more capacitors and/or resonators for the qubit device 100. As shown in FIGS. 10A and/or 10B at least a portion of the first superconducting silicon electrode 102 and/or the second superconducting silicon electrode can remain exposed by (e.g., not covered by) the one or more resist masks 202 deposited during the ninth stage of manufacturing.

Figure 11A:
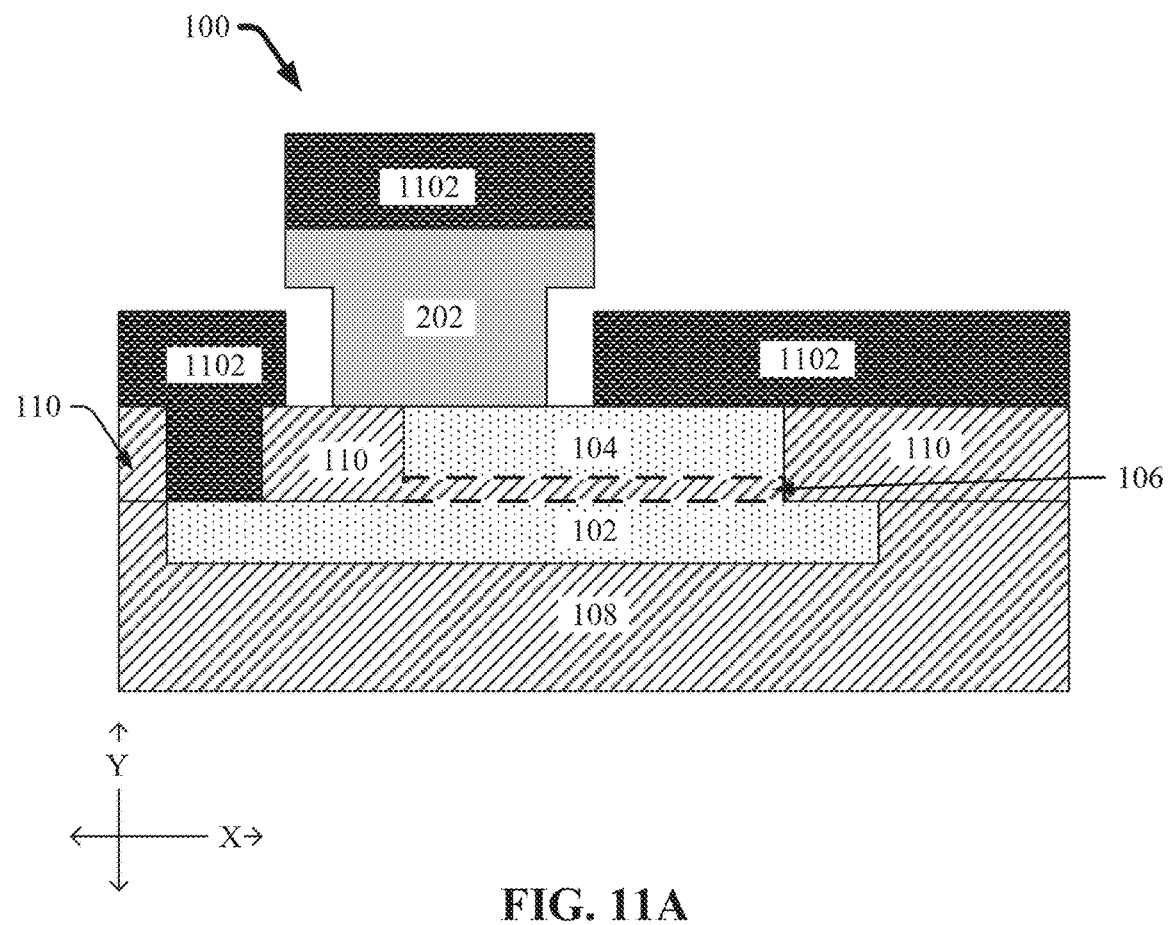
FIG. 11A illustrates a diagram of an example, non-limiting cross-sectional view of an apparatus comprising a silicon-based Josephson junction during a tenth stage of manufacturing in accordance with one or more embodiments described herein.
Figure 11B:
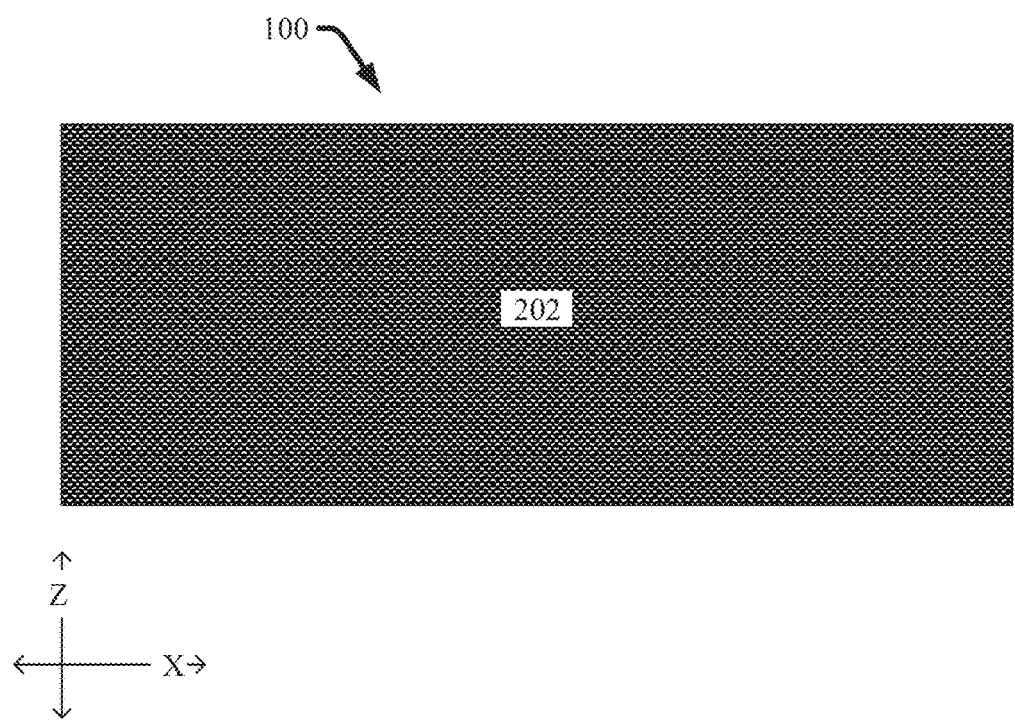
FIG. 11B illustrates a diagram of an example, non-limiting top-down view of an apparatus comprising a silicon-based Josephson junction during a tenth stage of manufacturing in accordance with one or more embodiments described herein.

FIGS. 11A and/or 11B illustrate diagrams of the example, non-limiting qubit device 100 during a tenth stage of manufacturing in accordance with one or more embodiments described herein. Repetitive description of like elements employed in other embodiments described herein is omitted for sake of brevity. FIG. 11A depicts a cross-sectional view of the qubit device 100 during the tenth stage of manufacturing, and/or FIG. 11B depicts a top-down view of the qubit device 100 during the tenth stage of manufacturing.

During the tenth stage of manufacturing, a conductive metal material 1102 can be deposited (e.g., via one or more deposition processes) onto the exposed surfaces of the qubit device 100 and/or the one or more resist masks 202. Subsequent to depositing the conductive metal material 1102, the resist masks 202 202 and portions of the conductive metal material 1102 positioned on the resist mask 202 can be removed (e.g., via one or more etching processes) to form the first metal contact 114 and/or second metal contact 116 (e.g., as shown in FIGS. 1A and/or 1B). Thereby, the conductive metal material 1102 can be the same metal comprised within the first metal contact 114 and/or second metal contact 116. As shown in FIG. 11A, the conductive metal material can be deposited into the contact hole 902 such that the conductive metal material is deposited onto the first superconducting silicon electrode 102. One of ordinary skill in the art will recognize that a thickness (e.g., along the "Y" axis) of the conductive metal material 1102 can vary depending on the function of the qubit device 100 and/or structural characteristics of the first metal contact 114 and/or second metal contact 116.

Figure 12A:
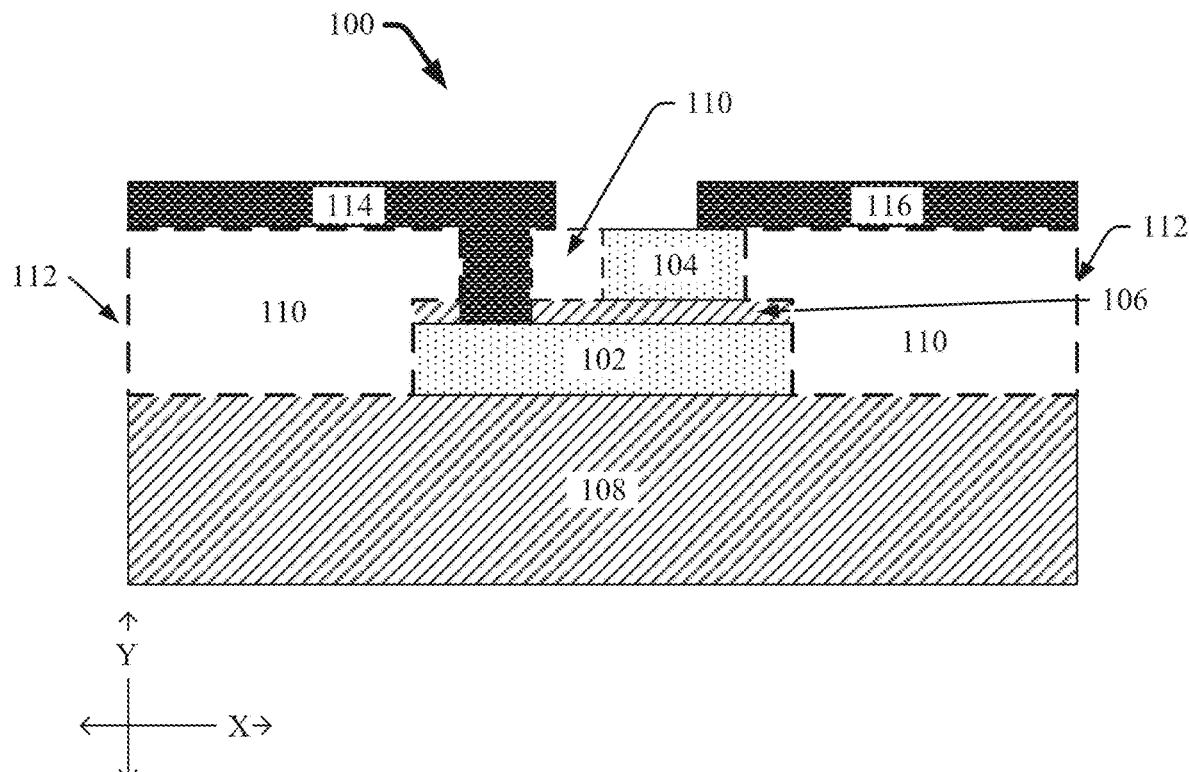
FIG. 12A illustrates a diagram of an example, non-limiting cross-sectional view of an apparatus comprising a silicon-based Josephson junction having one or more isolation implants in accordance with one or more embodiments described herein.
Figure 12B:
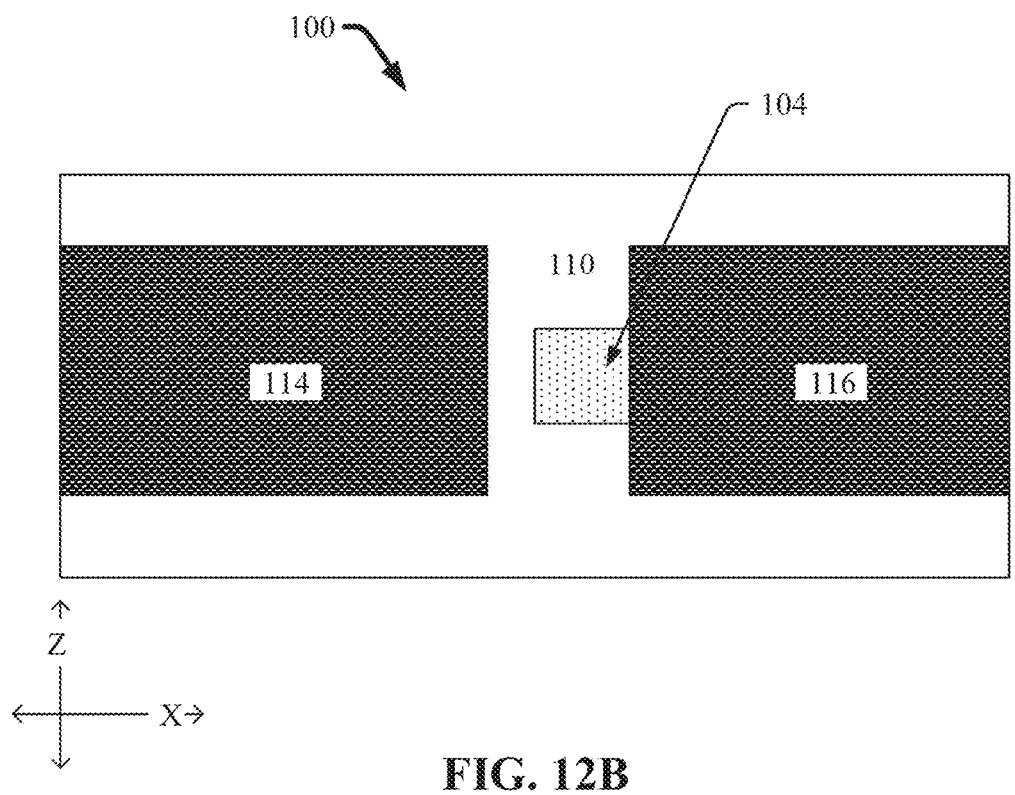
FIG. 12B illustrates a diagram of an example, non-limiting top-down view of an apparatus comprising a silicon-based Josephson junction having one or more isolation implants in accordance with one or more embodiments described herein.

FIGS. 12A and/or 12B illustrate diagrams of the example, non-limiting qubit device 100 having isolation layers 110 that can comprise one or more isolation implants in accordance with one or more embodiments described herein. Repetitive description of like elements employed in other embodiments described herein is omitted for sake of brevity. FIG. 12A depicts a cross-sectional view of the qubit device 100 comprising isolation implants, and/or FIG. 12B depicts a top-down view of the qubit device 100 comprising isolation implants.

In one or more embodiments, one or more isolation implants can be incorporated into one or more portions of the one or more silicon layers 402 and/or semiconductor substrate 108 to form the one or more isolation layers 110. Example isolation implants can include, but are not limited to: carbon, oxygen, nitrogen, a combination thereof, and/or the like. For instance, the one or more isolation implants can be incorporated into the portions of the one or more silicon layers 402 and/or semiconductor substrate 108 using one or more plasma immersion processes. In one or more embodiments, the one or more isolation implants can be carbon implants, wherein acetylene, benzene, a combination thereof, and/or the like can be used as a carbon source in the one or more plasma immersion processes. The one or more isolation implants can quench electrical conductivity of the one or more isolation layers 110, thereby defining the isolation region 112. In accordance with the various embodiments described herein, the qubit device 100 comprising isolation implants can comprise one or more silicon-based Josephson junction arranged in a stacked vertical orientation. Additionally, the tunnel barrier 106 of the qubit device 100 comprising isolation implants can comprise a dielectric material or a normal metal material in accordance with various embodiments described herein.

Figure 13:
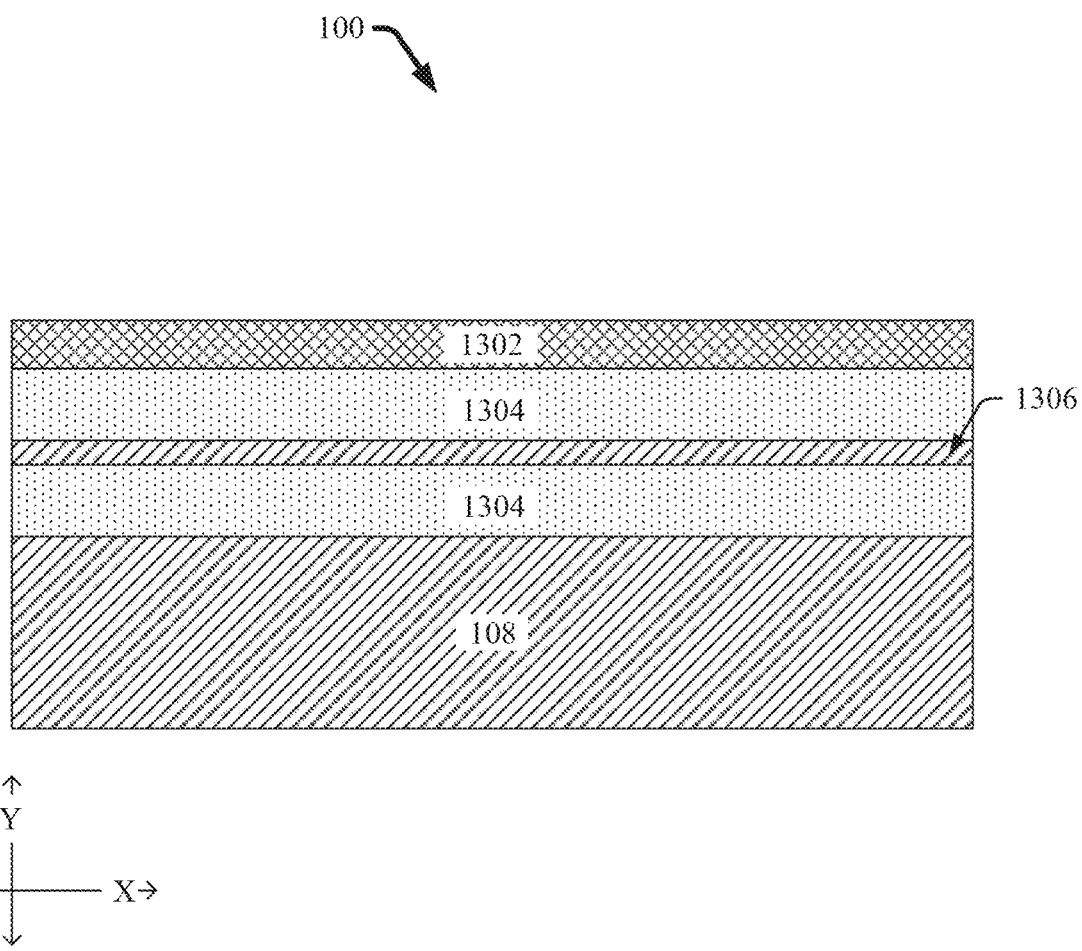
FIG. 13 illustrates a diagram of an example, non-limiting cross-sectional view of an apparatus comprising a silicon-based Josephson junction during a first stage of manufacturing in accordance with one or more embodiments described herein.

FIG. 13 illustrates a diagram of the example, non-limiting qubit device 100 comprising one or more isolation implants during a first stage of manufacturing in accordance with one or more embodiments described herein. Repetitive description of like elements employed in other embodiments described herein is omitted for sake of brevity. During the first stage of manufacturing, a cap layer 1302 can be deposited (e.g., via one or more deposition processes) onto a multi-layer structure comprising the semiconductor substrate 108, one or more superconducting silicon layers 1304, and/or a silicon barrier layer 1306. Example materials that can be comprised within the cap layer 1302 can include, but are not limited to: silicon oxide, silicon nitride, silicon, CVD carbon, a combination thereof, and/or the like. One of ordinary skill in the art will recognize that the thickness (e.g., along the "Y" axis) of the cap layer 1302 can vary. For example, the thickness (e.g., along the "Y" axis) of the cap layer 1302 can be greater than or equal to 5 nm and less than or equal to 500 nm (e.g., 30 nm to 100 nm).

As shown in FIG. 13, the silicon barrier layer 1306 can be positioned between one superconducting silicon layer 1304 (e.g., positioned on the semiconductor substrate 108) and another superconducting silicon layer 1304 (e.g., positioned adjacent to the cap layer 1302. In one or more embodiments, the superconducting silicon layers 1304 can proceed to constitute the first superconducting silicon electrode 102 and/or the second superconducting silicon electrode 104 in subsequent manufacturing steps. Thus, the superconducting silicon layers 1304 can comprise the same materials as the first superconducting silicon electrode 102 and/or the second superconducting silicon electrode 104 in accordance with the various embodiments described herein. Further, in one or more embodiments the multi-layer structure can be formed via one or more laser doping processes, epitaxial growth processes, and/or etching processes in accordance with one or more embodiments described herein (e.g., in accordance with the features shown in FIGS. 2-7B).

Figure 14A:
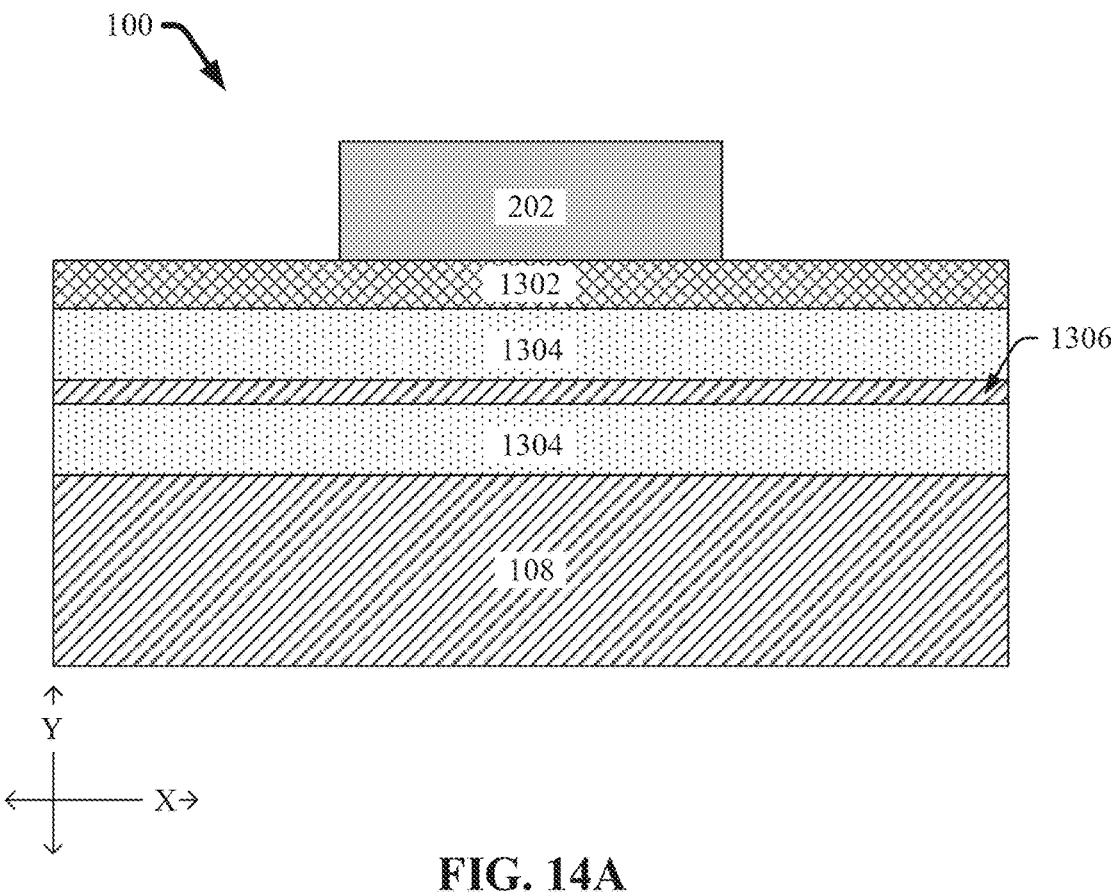
FIG. 14A illustrates a diagram of an example, non-limiting cross-sectional view of an apparatus comprising a silicon-based Josephson junction during a second stage of manufacturing in accordance with one or more embodiments described herein.
Figure 14B:
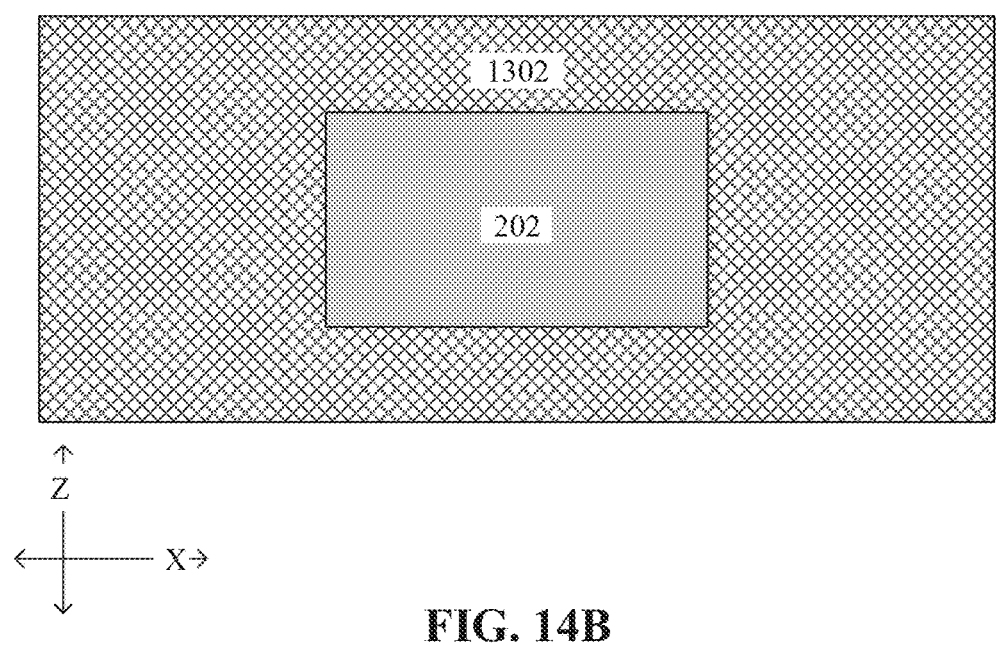
FIG. 14B illustrates a diagram of an example, non-limiting top-down view of an apparatus comprising a silicon-based Josephson junction during a second stage of manufacturing in accordance with one or more embodiments described herein.

FIGS. 14A and/or 14B illustrate diagrams of the example, non-limiting qubit device 100 comprising one or more isolation implants during a second stage of manufacturing in accordance with one or more embodiments described herein. Repetitive description of like elements employed in other embodiments described herein is omitted for sake of brevity. FIG. 14A depicts a cross-sectional view of the qubit device 100 comprising one or more isolation implants during the second stage of manufacturing, and/or FIG. 14B depicts a top-down view of the qubit device 100 comprising one or more isolation implants during the second stage of manufacturing. During the second stage of manufacturing of the qubit device 100 comprising one or more isolation implants, one or more resist layers 202 can be deposited (e.g., via one or more deposition processes) onto the cap layer 1302. In one or more embodiments, the one or more resist layers 202 can cover a portion of the cap layer 1302 aligned with the to-be-defined boundaries of the silicon-based Josephson junction.

Figure 15A:
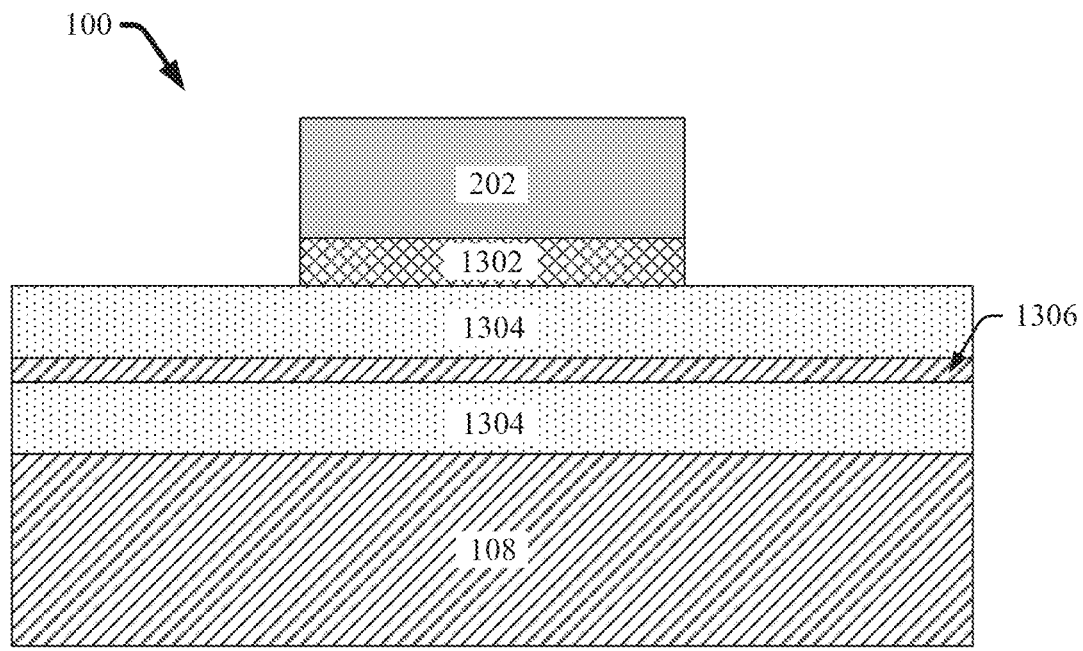
FIG. 15A illustrates a diagram of an example, non-limiting cross-sectional view of an apparatus comprising a silicon-based Josephson junction during a third stage of manufacturing in accordance with one or more embodiments described herein.
Figure 15B:
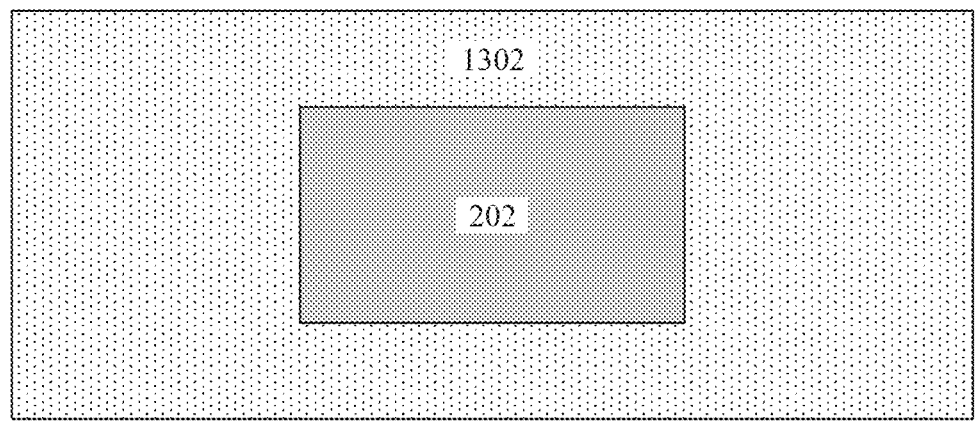
FIG. 15B illustrates a diagram of an example, non-limiting top-down view of an apparatus comprising a silicon-based Josephson junction during a third stage of manufacturing in accordance with one or more embodiments described herein.

FIGS. 15A and/or 15B illustrate diagrams of the example, non-limiting qubit device 100 comprising one or more isolation implants during a third stage of manufacturing in accordance with one or more embodiments described herein. Repetitive description of like elements employed in other embodiments described herein is omitted for sake of brevity. FIG. 15A depicts a cross-sectional view of the qubit device 100 comprising one or more isolation implants during the third stage of manufacturing, and/or FIG. 15B depicts a top-down view of the qubit device 100 comprising one or more isolation implants during the third stage of manufacturing. During the third stage of manufacturing of the qubit device 100 comprising one or more isolation implants, one or more of the exposed portions of the cap layer 1302 (e.g., portions not covered by the one or more resist masks 202) can be removed via one or more etching processes (e.g., using dilute hydrofluoric acid ("DHF"), and/or oxygen plasma).

Figure 16A:
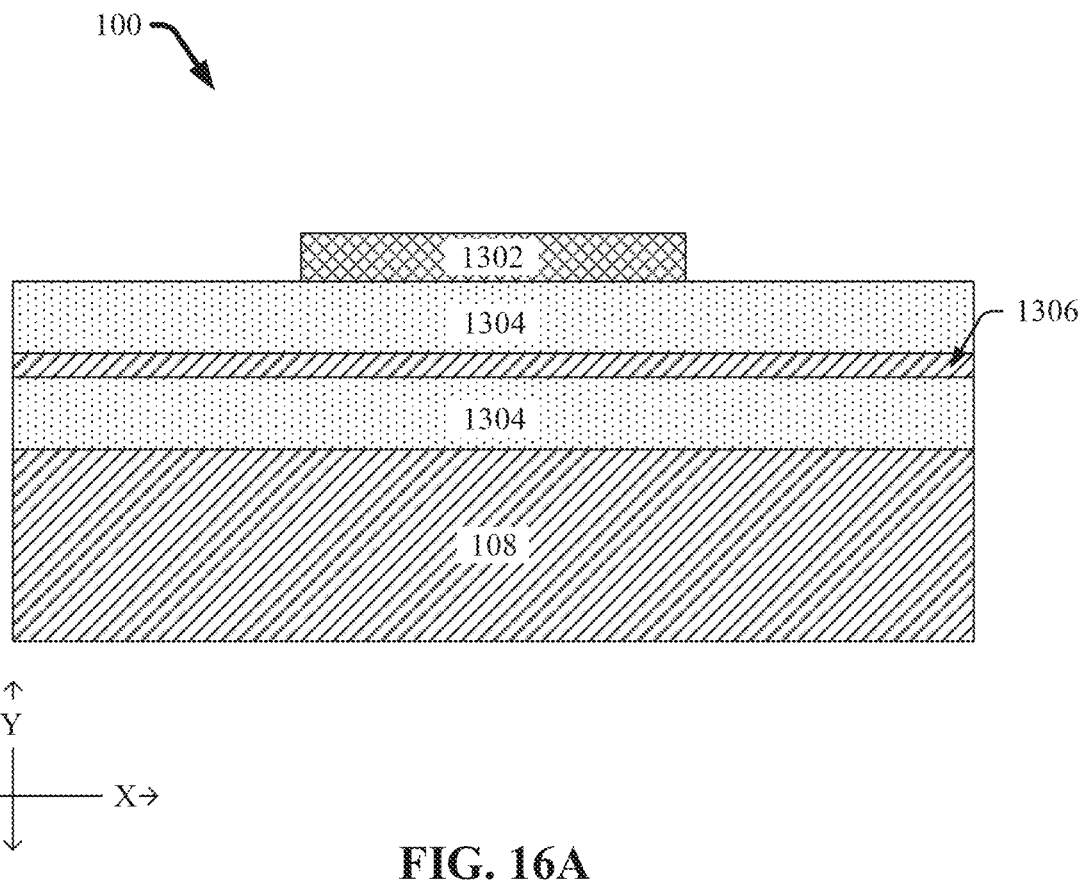
FIG. 16A illustrates a diagram of an example, non-limiting cross-sectional view of an apparatus comprising a silicon-based Josephson junction during a fourth stage of manufacturing in accordance with one or more embodiments described herein.
Figure 16B:
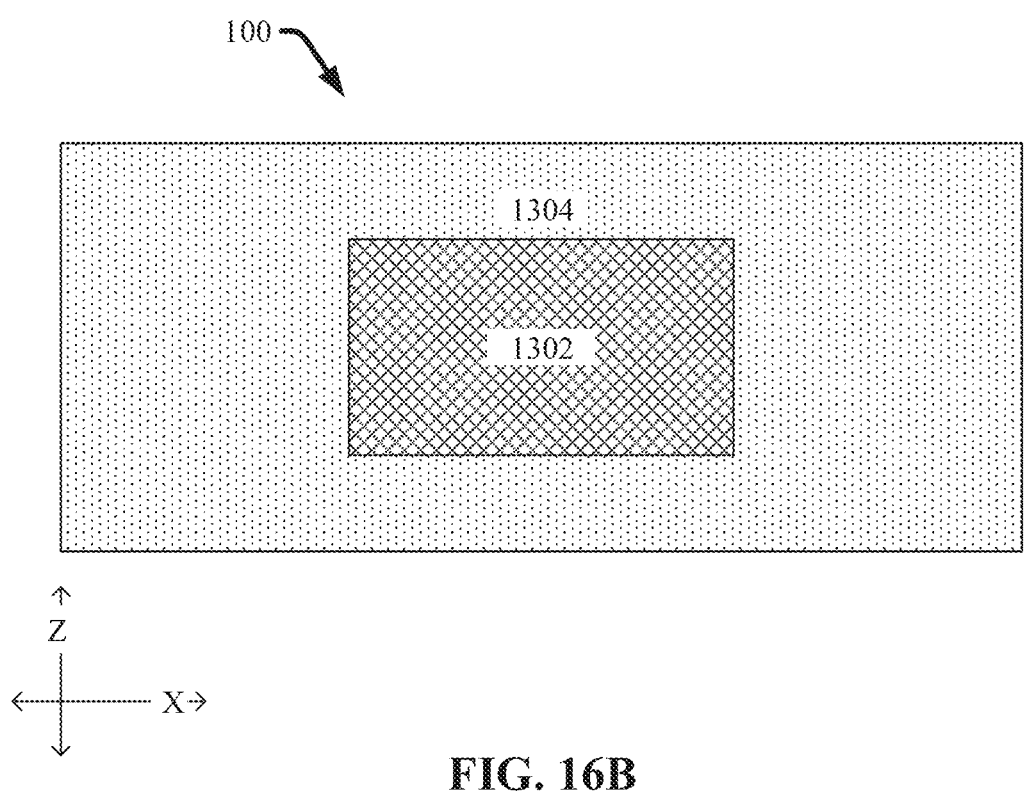
FIG. 16B illustrates a diagram of an example, non-limiting top-down view of an apparatus comprising a silicon-based Josephson junction during a fourth stage of manufacturing in accordance with one or more embodiments described herein.

FIGS. 16A and/or 16B illustrate diagrams of the example, non-limiting qubit device 100 comprising one or more isolation implants during a fourth stage of manufacturing in accordance with one or more embodiments described herein. Repetitive description of like elements employed in other embodiments described herein is omitted for sake of brevity. FIG. 16A depicts a cross-sectional view of the qubit device 100 comprising one or more isolation implants during the fourth stage of manufacturing, and/or FIG. 16B depicts a top-down view of the qubit device 100 comprising one or more isolation implants during the fourth stage of manufacturing. During the fourth stage of manufacturing of the qubit device 100 comprising one or more isolation implants, the one or more resist layers 202 can be removed via one or more etching processes to expose the remaining the portions of the cap layer 1302.

Figure 17A:
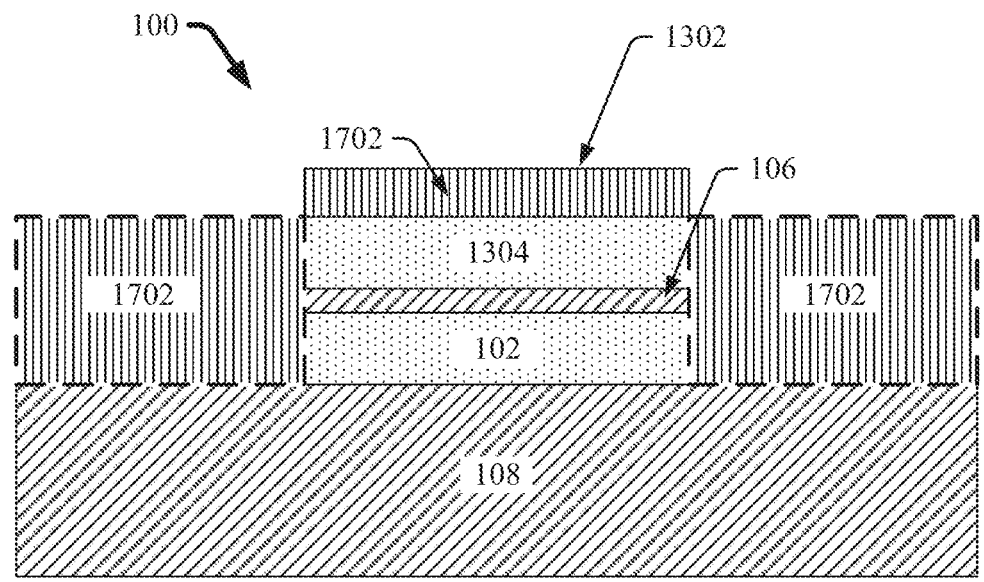
FIG. 17A illustrates a diagram of an example, non-limiting cross-sectional view of an apparatus comprising a silicon-based Josephson junction during a fifth stage of manufacturing in accordance with one or more embodiments described herein.
Figure 17A:
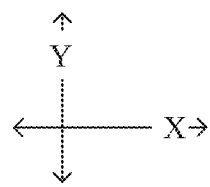
Figure 17B:
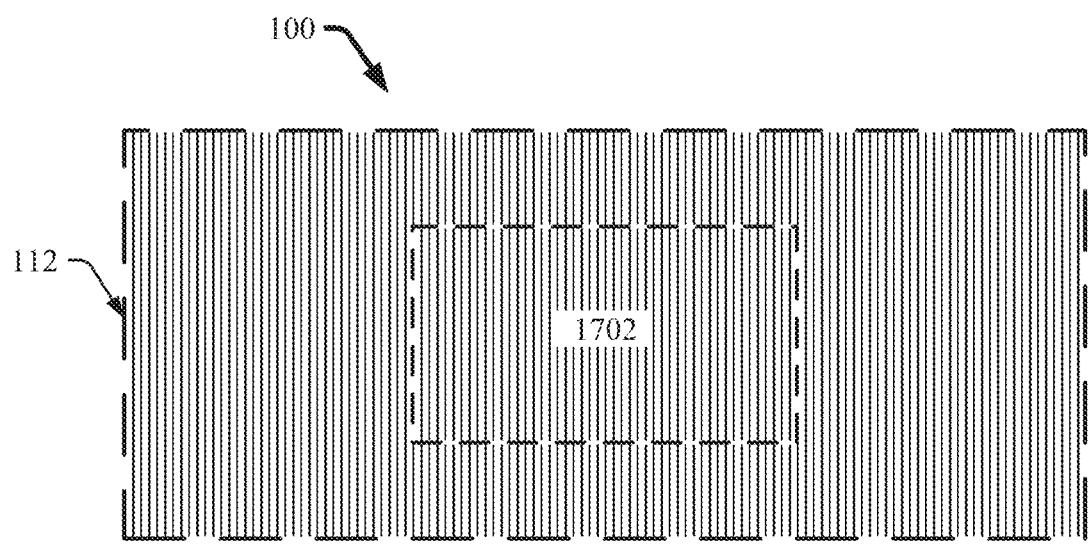
FIG. 17B illustrates a diagram of an example, non-limiting top-down view of an apparatus comprising a silicon-based Josephson junction during a fifth stage of manufacturing in accordance with one or more embodiments described herein.
Figure 17B:
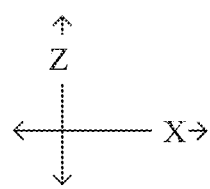

FIGS. 17A and/or 17B illustrate diagrams of the example, non-limiting qubit device 100 comprising one or more isolation implants during a fifth stage of manufacturing in accordance with one or more embodiments described herein. Repetitive description of like elements employed in other embodiments described herein is omitted for sake of brevity. FIG. 17A depicts a cross-sectional view of the qubit device 100 comprising one or more isolation implants during the fifth stage of manufacturing, and/or FIG. 17B depicts a top-down view of the qubit device 100 comprising one or more isolation implants during the fifth stage of manufacturing.

During the fifth stage of manufacturing of the qubit device 100 comprising one or more isolation implants, the cap layer 1302 and/or one or more portions of the multi-layer stack (e.g., comprising the one or more superconducting silicon layers 1304 and/or silicon barrier layer 1306) can be subject to a first plasma immersion 1702 with one or more isolation implant sources. For example, wherein the one or more isolation implants are carbon, the cap layer 1302 and/or one or more portions of the multi-layer stack can be subject to a first plasma immersion 1702 with one or more carbon sources, such as acetylene, benzene, a combination thereof, and/or the like. As shown in FIGS. 17A and/or 17B, the cap layer 1302 and/or one or more portions of the multi-layer stack can be saturated with the isolation implant source (e.g., carbon source, such as acetylene, benzene, a combination thereof, and/or the like).

In various embodiments, the one or more portions of the multi-layer stack subject to the first plasma immersion 1702 can be the isolation regions 112 of the qubit device 100. Thereby, the first plasma immersion 1702 can define one or more boundaries of the one or more Josephson junctions comprised within the qubit device 100. For example, the first plasma immersion 1702 can define the structural boundaries of the first superconducting silicon electrode 102 and/or the tunnel barrier 106 (e.g., as shown in FIG. 17A).

Figure 18A:
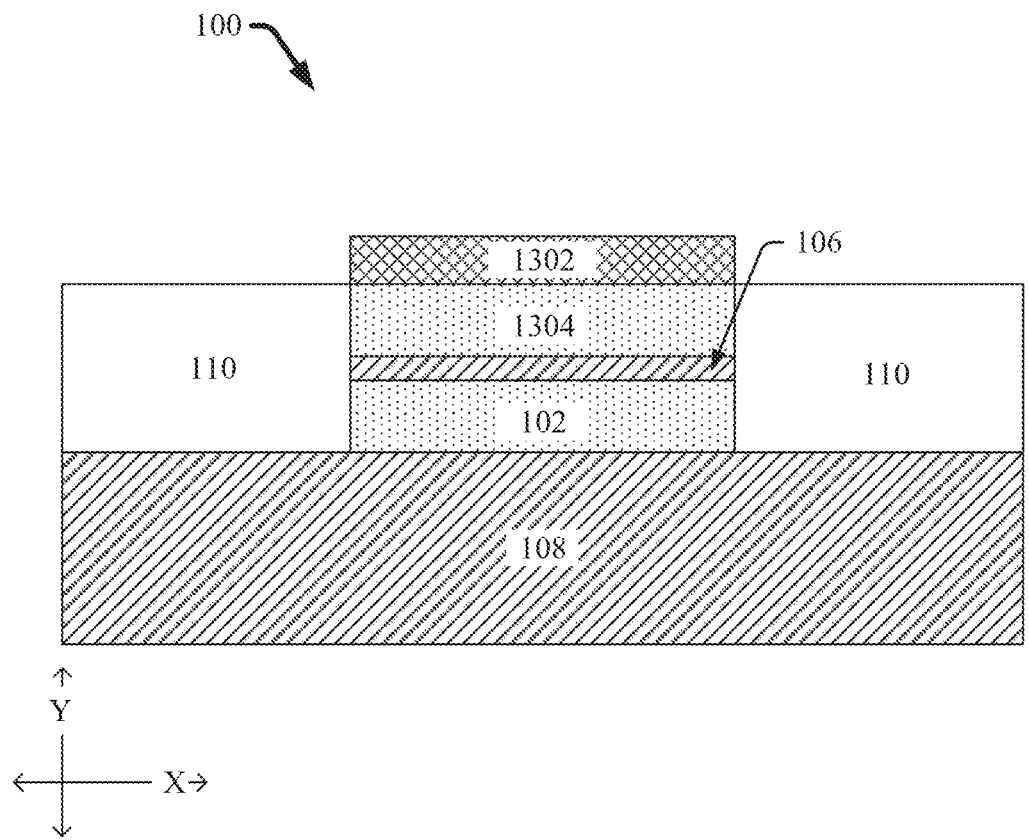
FIG. 18A illustrates a diagram of an example, non-limiting cross-sectional view of an apparatus comprising a silicon-based Josephson junction during a sixth stage of manufacturing in accordance with one or more embodiments described herein.
Figure 18B:
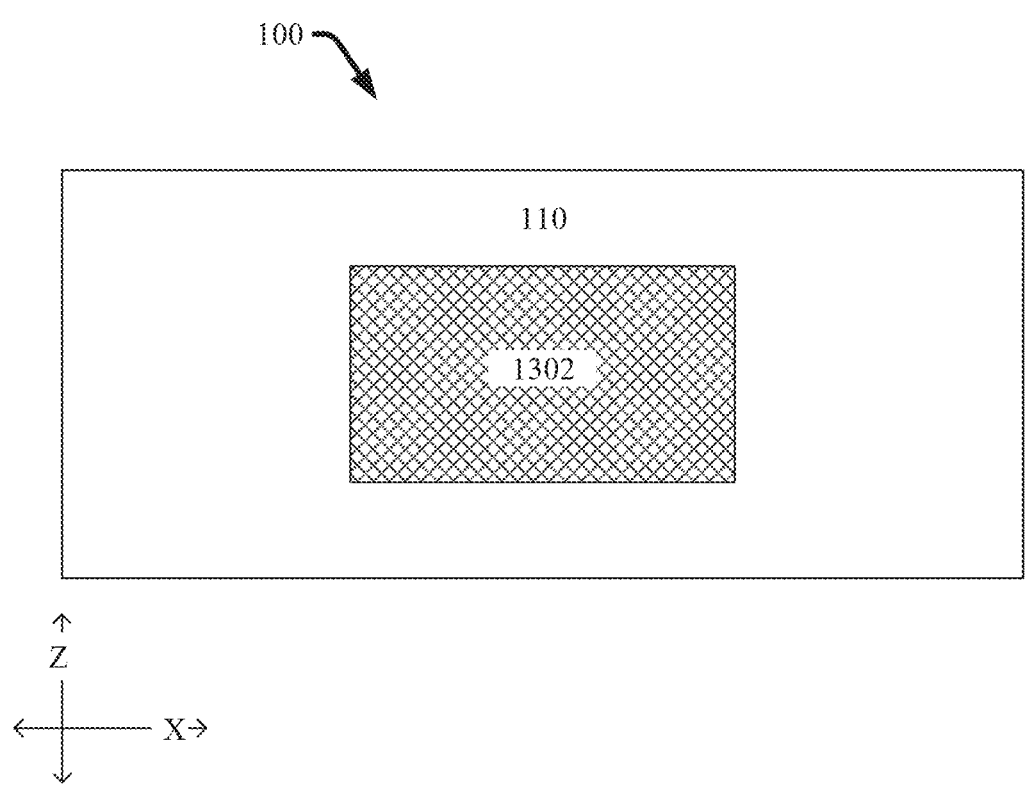
FIG. 18B illustrates a diagram of an example, non-limiting top-down view of an apparatus comprising a silicon-based Josephson junction during a sixth stage of manufacturing in accordance with one or more embodiments described herein.

FIGS. 18A and/or 18B illustrate diagrams of the example, non-limiting qubit device 100 comprising one or more isolation implants during a sixth stage of manufacturing in accordance with one or more embodiments described herein. Repetitive description of like elements employed in other embodiments described herein is omitted for sake of brevity. FIG. 18A depicts a cross-sectional view of the qubit device 100 comprising one or more isolation implants during the sixth stage of manufacturing, and/or FIG. 18B depicts a top-down view of the qubit device 100 comprising one or more isolation implants during the sixth stage of manufacturing.

During the sixth stage of manufacturing of the qubit device 100 comprising one or more isolation implants, the portions of the qubit device 100 saturated with the isolation implant source can be annealed (e.g., laser annealed) to implant (e.g., and/or reduce lattice damage) the isolation implant. For instance, the laser anneal can melt the silicon in the irradiated region, wherein the pulsing time can be established based on how much silicon is desired to be melted. For example, in one or more embodiments the isolation region 112 can be annealed (e.g., laser annealed) to form one or more isolation layers 110 that can quench electrical conductivity within the isolation region 112. For instance, in various embodiments the isolation region 112 can be saturated by a carbon source in the fifth stage and laser annealed in the sixth stage to implant one or more carbon isolation implants into the isolation region 112 to form one or more isolation layers 110. As shown in FIGS. 18A and/or 18B, the cap layer 1302 can protect the superconducting silicon layer 1304, tunnel barrier 106, and/or first superconducting silicon electrode 102 from being implanted with the isolation implant during the sixth stage.

Figure 19A:
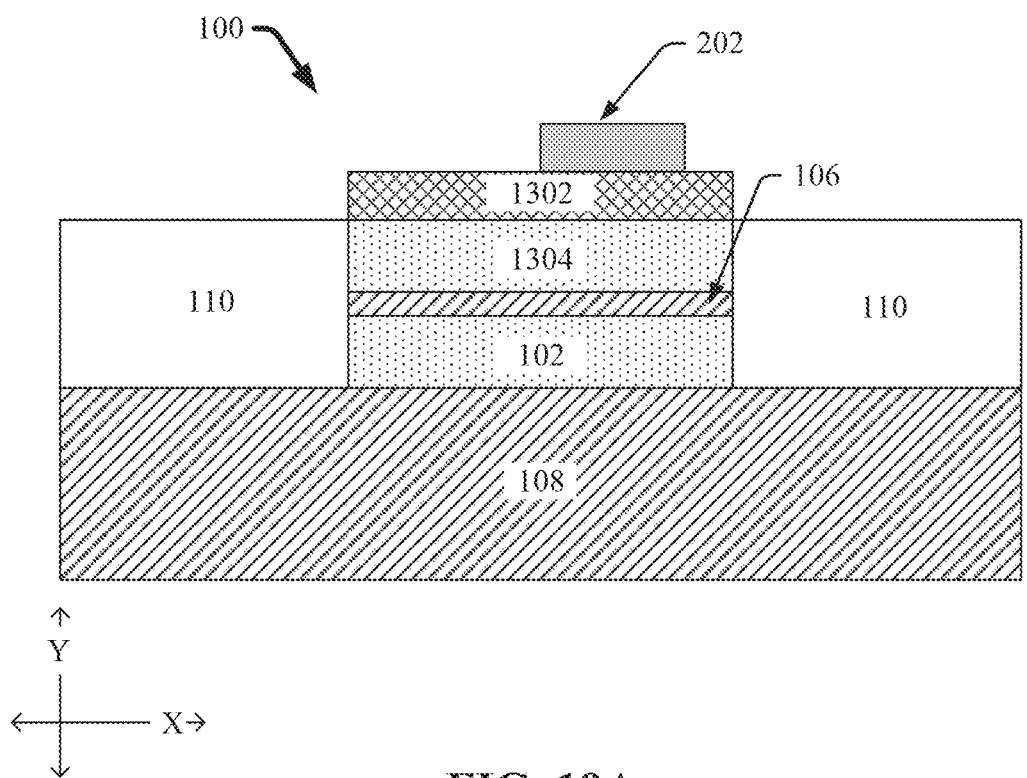
FIG. 19A illustrates a diagram of an example, non-limiting cross-sectional view of an apparatus comprising a silicon-based Josephson junction during a seventh stage of manufacturing in accordance with one or more embodiments described herein.
Figure 19B:
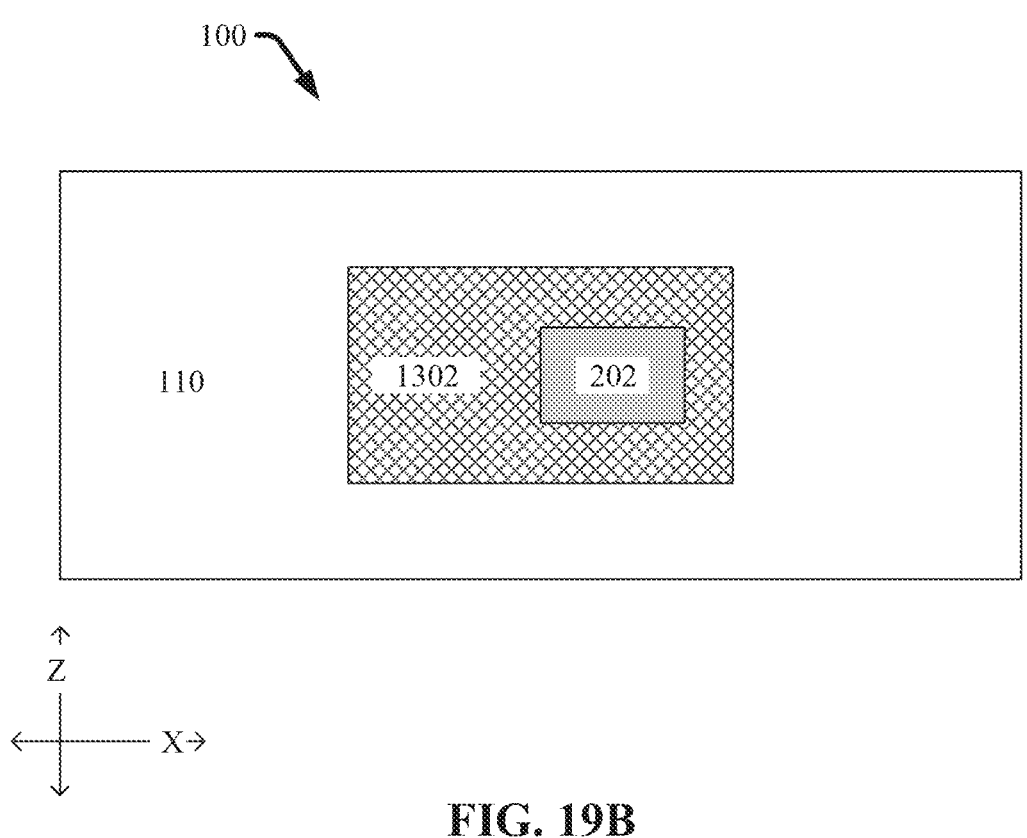
FIG. 19B illustrates a diagram of an example, non-limiting top-down view of an apparatus comprising a silicon-based Josephson junction during a seventh stage of manufacturing in accordance with one or more embodiments described herein.

FIGS. 19A and/or 19B illustrate diagrams of the example, non-limiting qubit device 100 comprising one or more isolation implants during a seventh stage of manufacturing in accordance with one or more embodiments described herein. Repetitive description of like elements employed in other embodiments described herein is omitted for sake of brevity. FIG. 19A depicts a cross-sectional view of the qubit device 100 comprising one or more isolation implants during the seventh stage of manufacturing, and/or FIG. 19B depicts a top-down view of the qubit device 100 comprising one or more isolation implants during the seventh stage of manufacturing.

During the seventh stage of manufacturing of the qubit device 100 comprising one or more isolation implants, one or more resist layers 202 can be deposited (e.g., via one or more deposition processes) onto the cap layer 1302. In one or more embodiments, the one or more resist layers 202 can cover a portion of the cap layer 1302 aligned with the to-be-defined boundaries of the second superconducting silicon electrode 104.

Figure 20A:
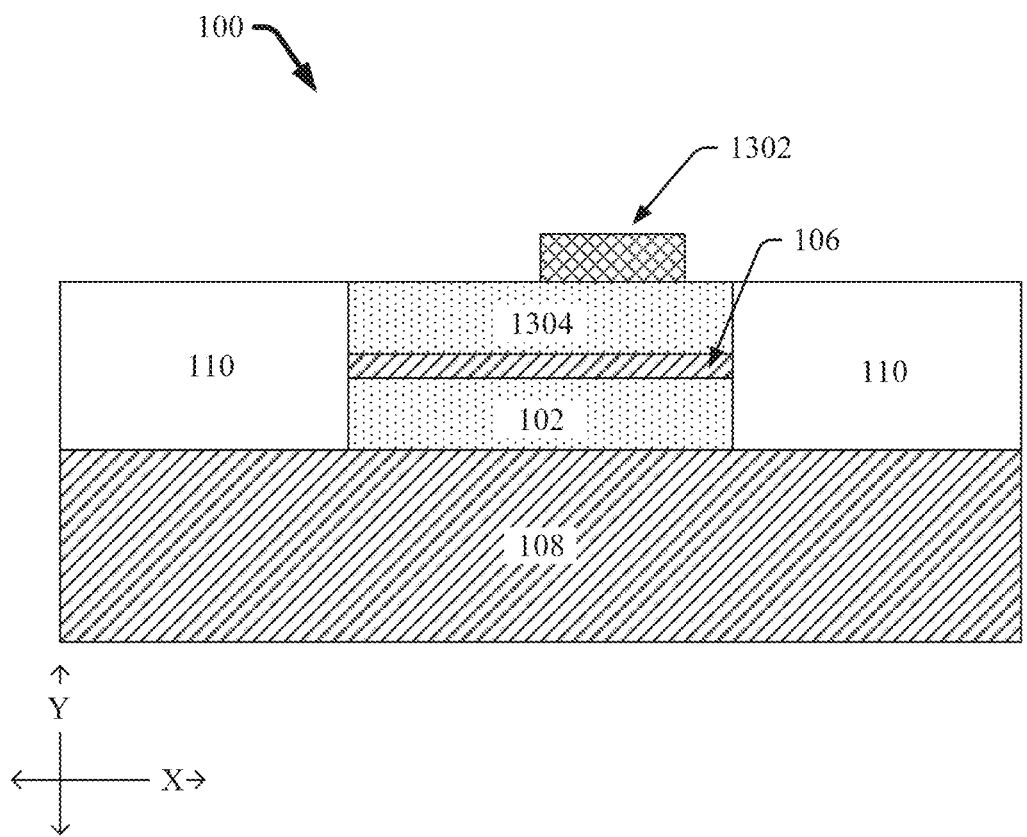
FIG. 20A illustrates a diagram of an example, non-limiting cross-sectional view of an apparatus comprising a silicon-based Josephson junction during an eighth stage of manufacturing in accordance with one or more embodiments described herein.
Figure 20B:
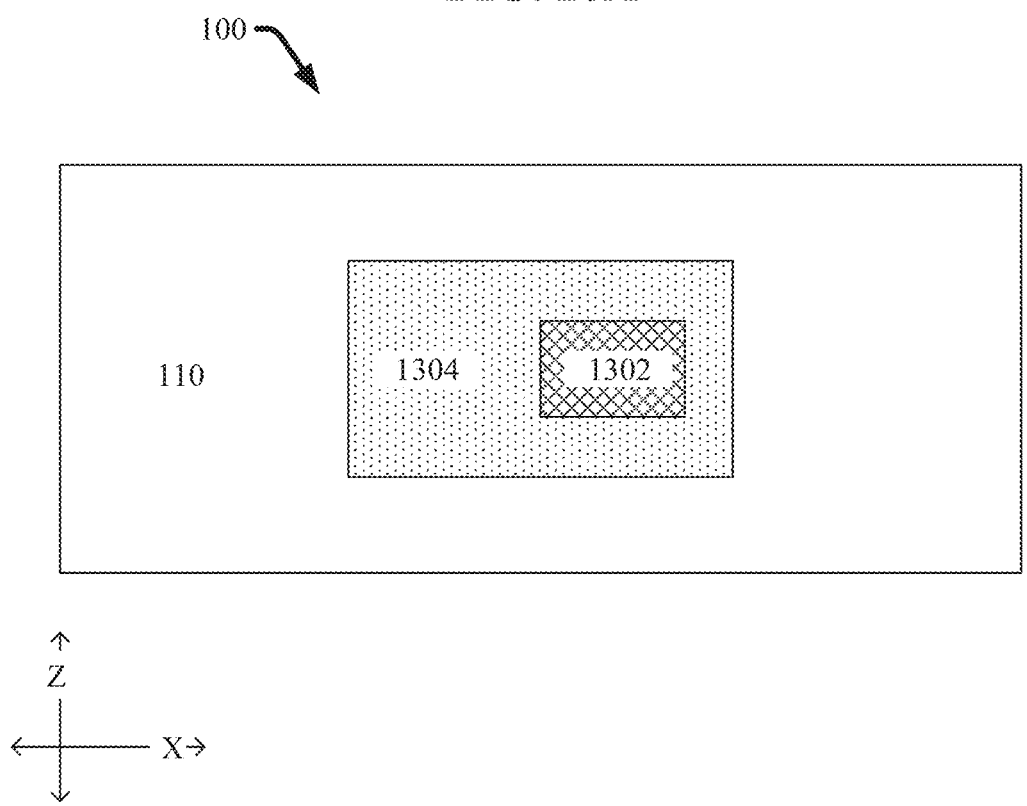
FIG. 20B illustrates a diagram of an example, non-limiting top-down view of an apparatus comprising a silicon-based Josephson junction during an eighth stage of manufacturing in accordance with one or more embodiments described herein.

FIGS. 20A and/or 20B illustrate diagrams of the example, non-limiting qubit device 100 comprising one or more isolation implants during an eighth stage of manufacturing in accordance with one or more embodiments described herein. Repetitive description of like elements employed in other embodiments described herein is omitted for sake of brevity. FIG. 20A depicts a cross-sectional view of the qubit device 100 comprising one or more isolation implants during the eighth stage of manufacturing, and/or FIG. 20B depicts a top-down view of the qubit device 100 comprising one or more isolation implants during the eighth stage of manufacturing. During the eighth stage of manufacturing of the qubit device 100 comprising one or more isolation implants, one or more of the exposed portions of the cap layer 1302 (e.g., portions not covered by the one or more resist masks 202) can be removed via one or more etching processes (e.g., using DHF). Subsequently, the remaining portion of the one or more resist masks 202 can be removed. Thereby, the remaining portion of the cap layer 1302 can be positioned over (e.g., along the "Y" axis) the to-be-defined location of the second superconducting silicon electrode 104.

Figure 21A:
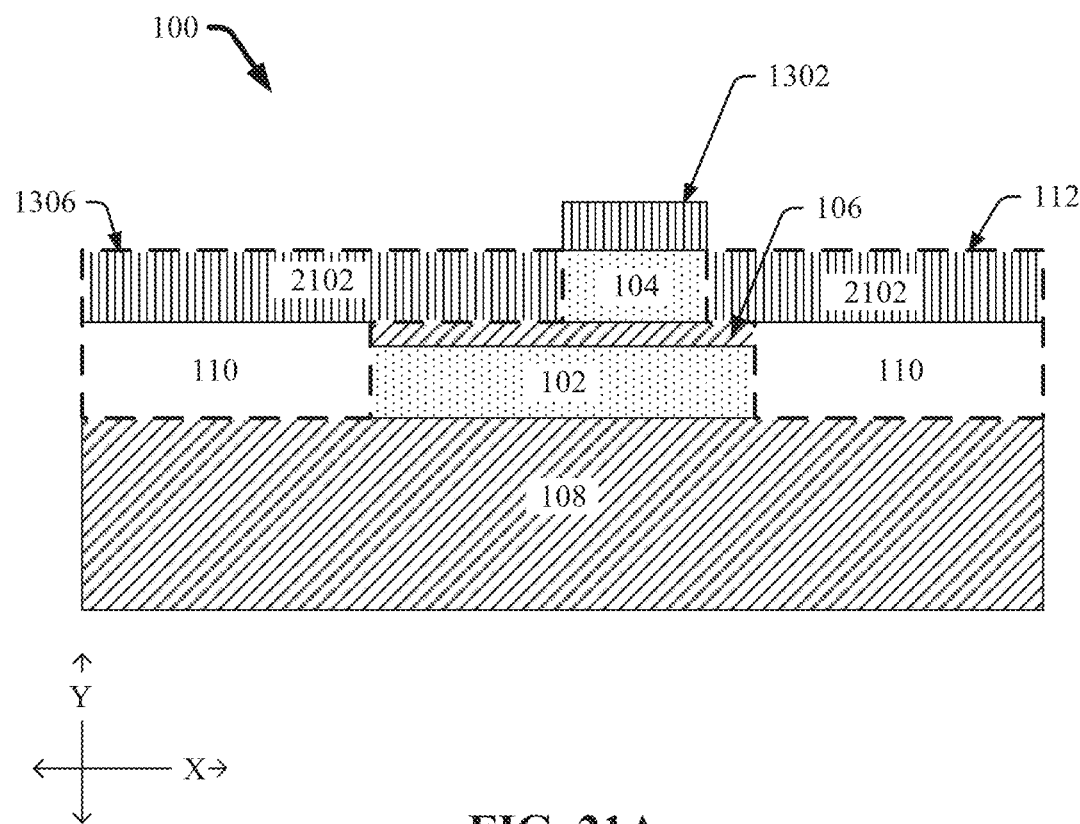
FIG. 21A illustrates a diagram of an example, non-limiting cross-sectional view of an apparatus comprising a silicon-based Josephson junction during a ninth stage of manufacturing in accordance with one or more embodiments described herein.
Figure 21B:
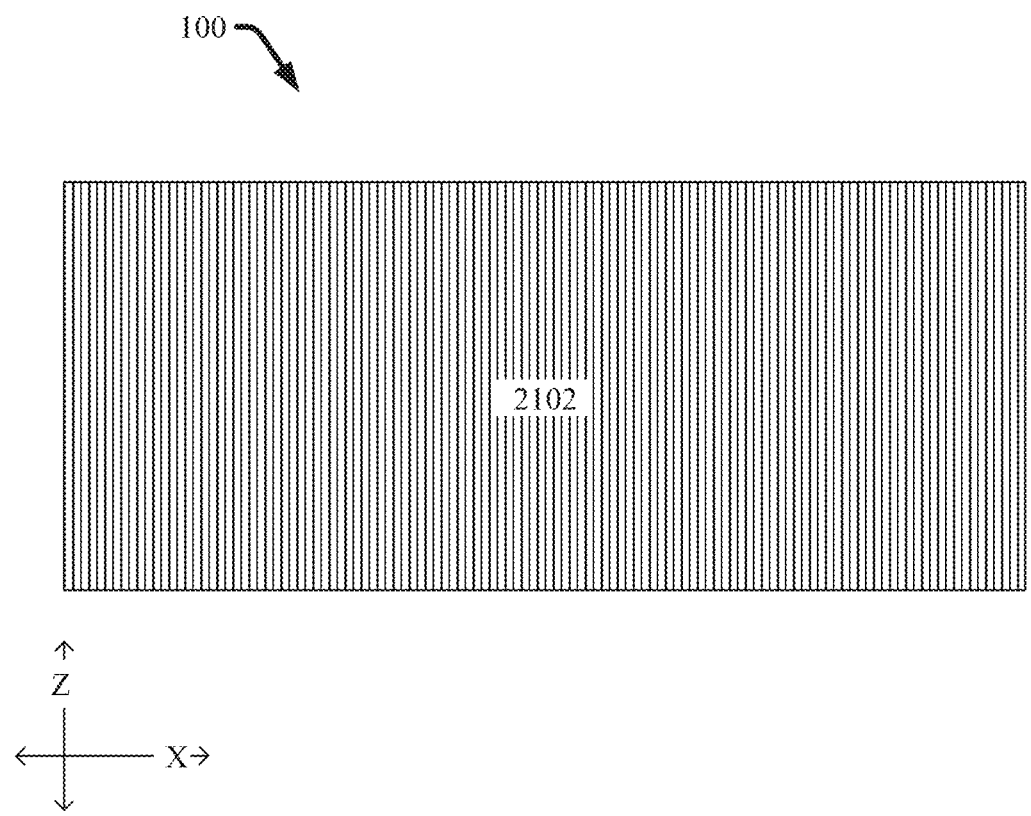
FIG. 21B illustrates a diagram of an example, non-limiting top-down view of an apparatus comprising a silicon-based Josephson junction during a ninth stage of manufacturing in accordance with one or more embodiments described herein.

FIGS. 21A and/or 21B illustrate diagrams of the example, non-limiting qubit device 100 comprising one or more isolation implants during a ninth stage of manufacturing in accordance with one or more embodiments described herein. Repetitive description of like elements employed in other embodiments described herein is omitted for sake of brevity. FIG. 21A depicts a cross-sectional view of the qubit device 100 comprising one or more isolation implants during the ninth stage of manufacturing, and/or FIG. 21B depicts a top-down view of the qubit device 100 comprising one or more isolation implants during the ninth stage of manufacturing.

During the ninth stage of manufacturing of the qubit device 100 comprising one or more isolation implants, the cap layer 1302 and/or one or more portions of the remaining superconducting silicon layer 1304 can be subject to a second plasma immersion 2102 with one or more isolation implant sources. For example, wherein the one or more isolation implants are carbon, the cap layer 1302 and/or one or more portions of the superconducting silicon layer 1304 can be subject to a second plasma immersion 2102 with one or more carbon sources, such as acetylene, benzene, a combination thereof, and/or the like. As shown in FIGS. 21A and/or 21B, the cap layer 1302 and/or one or more portions of the superconducting silicon layer 1304 can be saturated with the isolation implant source (e.g., carbon source, such as acetylene, benzene, a combination thereof, and/or the like). In various embodiments, the one or more portions of the superconducting silicon layer 1304 subject to the second plasma immersion 2102 can extend the isolation regions 112 (e.g., delineated by bold dashed lines in FIG. 21A) of the qubit device 100. Thereby, the second plasma immersion 2102 can define one or more boundaries of the second superconducting silicon electrode 104 (e.g., as shown in FIGS. 21A and/or 21B).

Figure 22A:
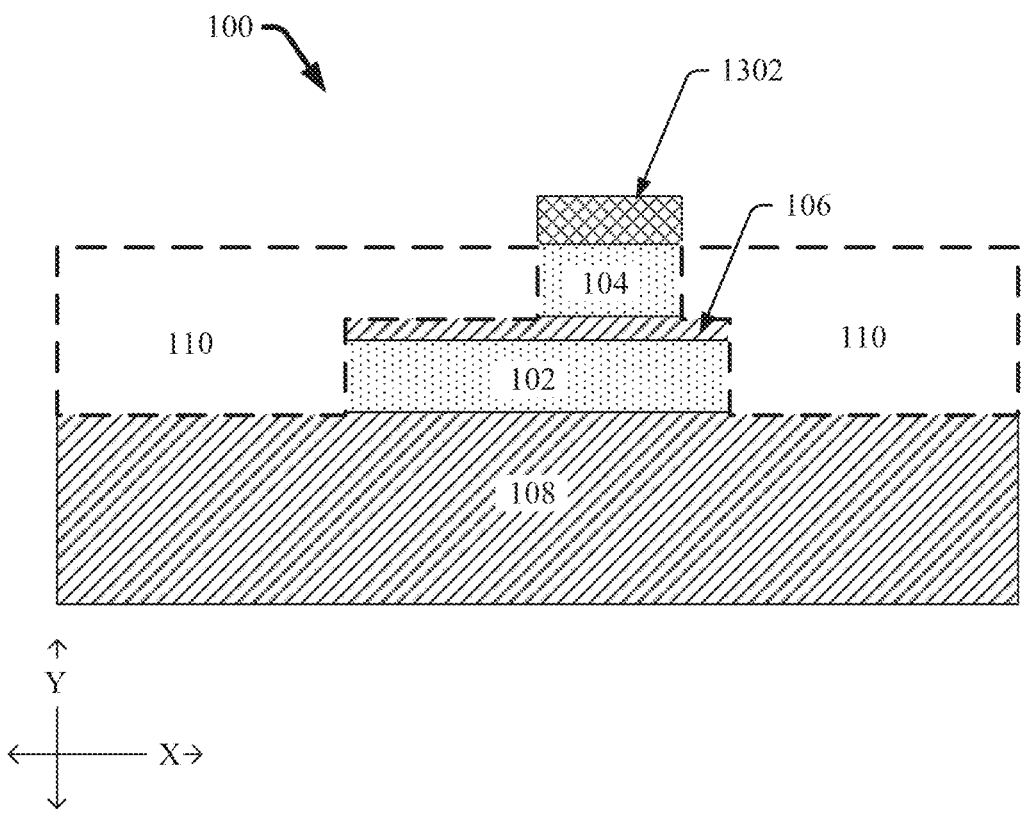
FIG. 22A illustrates a diagram of an example, non-limiting cross-sectional view of an apparatus comprising a silicon-based Josephson junction during a tenth stage of manufacturing in accordance with one or more embodiments described herein.
Figure 22B:
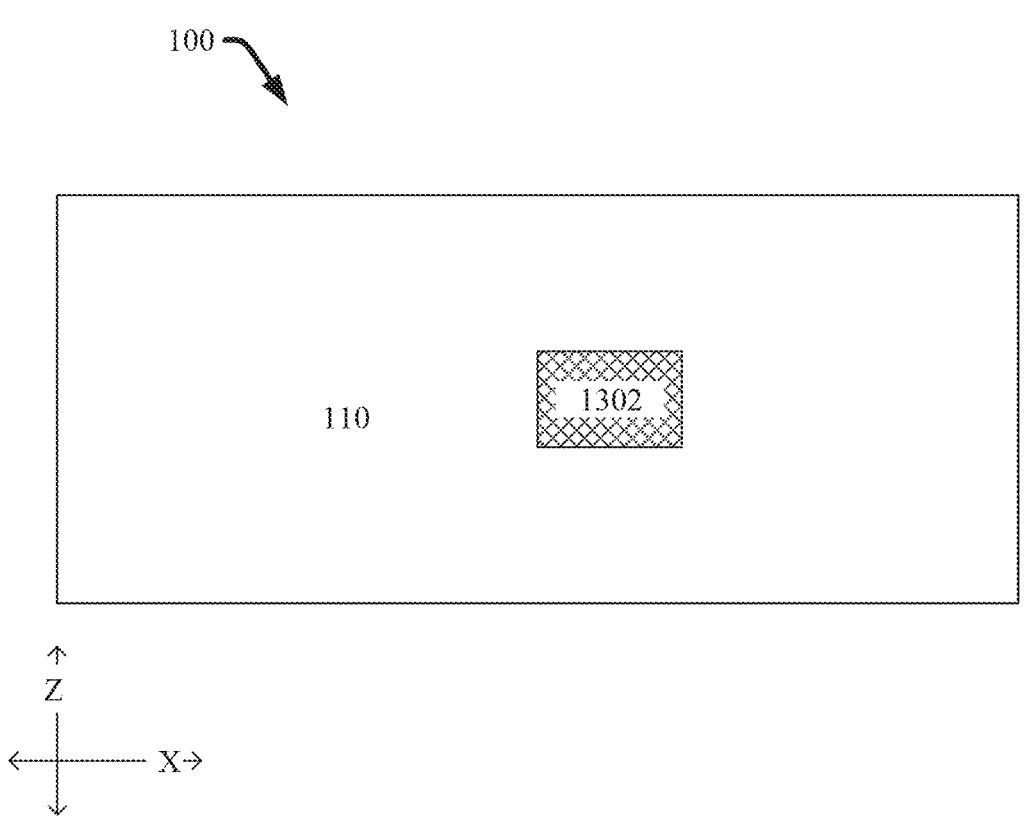
FIG. 22B illustrates a diagram of an example, non-limiting top-down view of an apparatus comprising a silicon-based Josephson junction during a tenth stage of manufacturing in accordance with one or more embodiments described herein.

FIGS. 22A and/or 22B illustrate diagrams of the example, non-limiting qubit device 100 comprising one or more isolation implants during a tenth stage of manufacturing in accordance with one or more embodiments described herein. Repetitive description of like elements employed in other embodiments described herein is omitted for sake of brevity. FIG. 22A depicts a cross-sectional view of the qubit device 100 comprising one or more isolation implants during the tenth stage of manufacturing, and/or FIG. 22B depicts a top-down view of the qubit device 100 comprising one or more isolation implants during the tenth stage of manufacturing.

During the tenth stage of manufacturing of the qubit device 100 comprising one or more isolation implants, the portions of the qubit device 100 saturated with the isolation implant source can be annealed (e.g., laser annealed) to implant the isolation implant. For example, in one or more embodiments the isolation region 112 can be annealed (e.g., laser annealed) to form one or more isolation layers 110 that can quench electrical conductivity within the isolation region 112. For instance, in various embodiments the isolation region 112 can be saturated by a carbon source in the ninth stage and laser annealed in the tenth stage to implant one or more carbon isolation implants into the isolation region 112 to extend the one or more isolation layers 110. As shown in FIGS. 22A and/or 22B, the cap layer 1302 can protect the second superconducting silicon electrode 104 from being implanted with the isolation implant during the tenth stage. Further, in one or more embodiments the tunnel barrier 106 and/or the first superconducting silicon electrode 102 can remain free from being implanted with the isolation implant during the tenth stage controlling the depth (e.g., along the "Y" axis) of saturation of the isolation implant source during the ninth stage of manufacturing, and thereby the depth (e.g., along the "Y" axis) of isolation implant incorporation during the tenth stage of manufacturing.

Figure 23A:
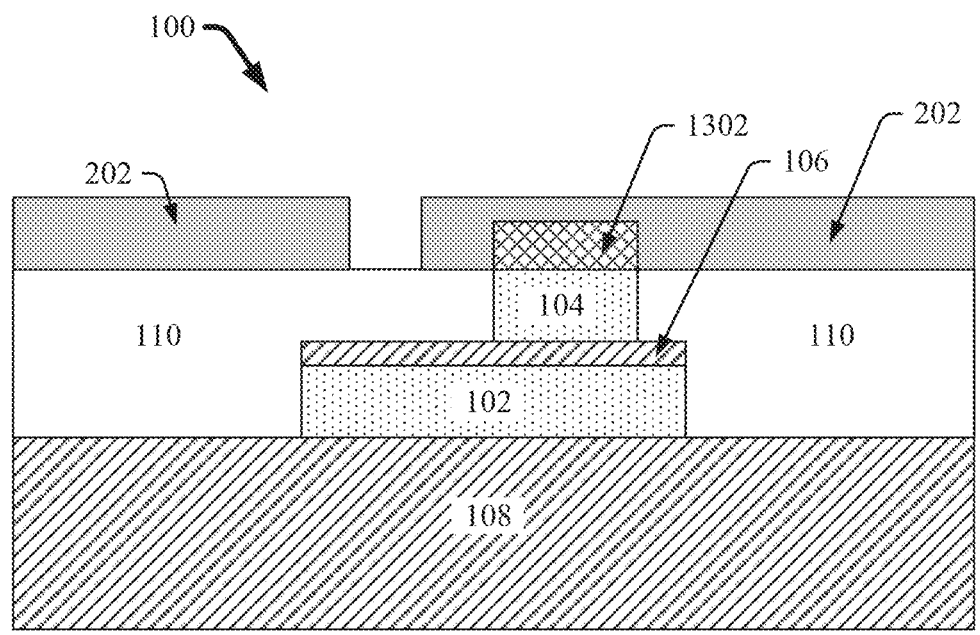
FIG. 23A illustrates a diagram of an example, non-limiting cross-sectional view of an apparatus comprising a silicon-based Josephson junction during an eleventh stage of manufacturing in accordance with one or more embodiments described herein.
Figure 23B:
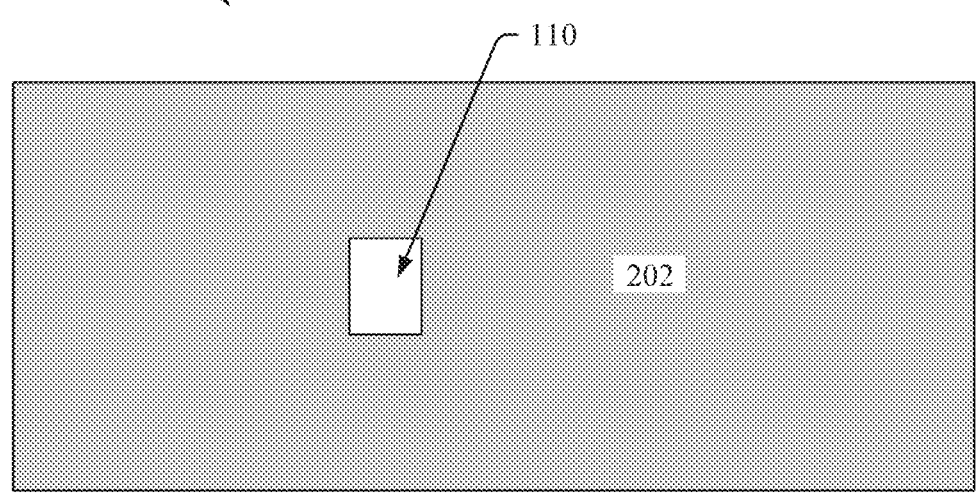
FIG. 23B illustrates a diagram of an example, non-limiting top-down view of an apparatus comprising a silicon-based Josephson junction during an eleventh stage of manufacturing in accordance with one or more embodiments described herein.

FIGS. 23A and/or 23B illustrate diagrams of the example, non-limiting qubit device 100 during an eleventh stage of manufacturing in accordance with one or more embodiments described herein. Repetitive description of like elements employed in other embodiments described herein is omitted for sake of brevity. FIG. 23A depicts a cross-sectional view of the qubit device 100 during the eleventh stage of manufacturing, and/or FIG. 23B depicts a top-down view of the qubit device 100 during the eleventh stage of manufacturing.

During the eleventh stage of manufacturing, one or more resist masks 202 can be deposited onto the one or more isolation layers 110 and/or the cap layer 1302 via one or more deposition processes. As shown in FIGS. 23A and/or 23B, the resist mask 202 can be deposited so as to leave a portion of the one or more isolation layers 110 exposed. Further, the exposed portion of the one or more isolation layers 110 (e.g., the portion not covered by resist mask 202) can be aligned with a portion of the first superconducting silicon electrode 102 along the "Y" axis (e.g., as shown in FIG. 23A).

Figure 24A:
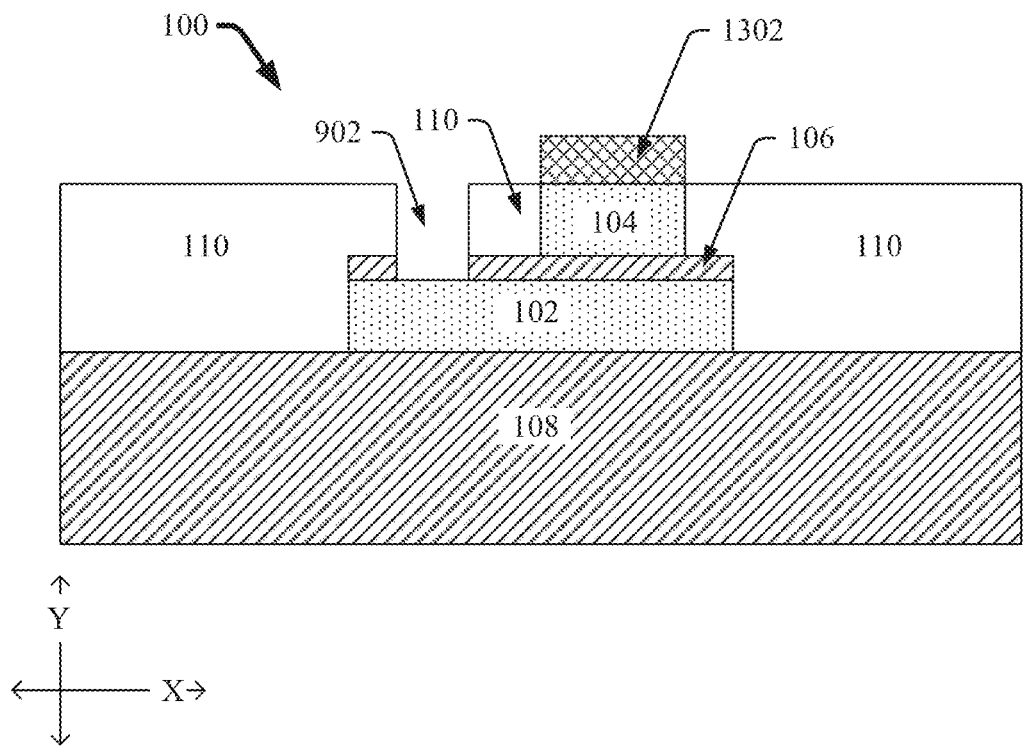
FIG. 24A illustrates a diagram of an example, non-limiting cross-sectional view of an apparatus comprising a silicon-based Josephson junction during a twelfth stage of manufacturing in accordance with one or more embodiments described herein.
Figure 24B:
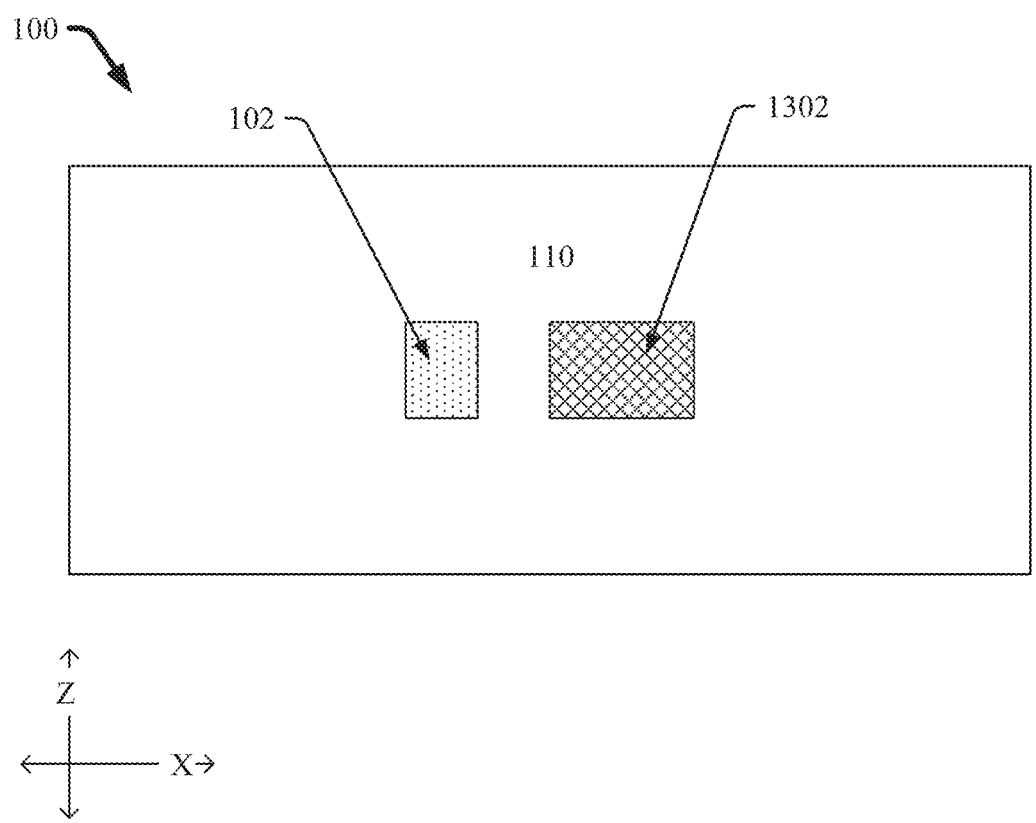
FIG. 24B illustrates a diagram of an example, non-limiting top-down view of an apparatus comprising a silicon-based Josephson junction during a twelfth stage of manufacturing in accordance with one or more embodiments described herein.

FIGS. 24A and/or 24B illustrate diagrams of the example, non-limiting qubit device 100 during a twelfth stage of manufacturing in accordance with one or more embodiments described herein. Repetitive description of like elements employed in other embodiments described herein is omitted for sake of brevity. FIG. 24A depicts a cross-sectional view of the qubit device 100 during the twelfth stage of manufacturing, and/or FIG. 24B depicts a top-down view of the qubit device 100 during the twelfth stage of manufacturing.

During the twelfth stage of manufacturing, the exposed portion of the one or more isolation layers 110 can be etched away (e.g., via one or more etching processes, such as RIE) to form a contact hole 902 in the isolation layers 110 that can extend to the first superconducting silicon electrode 102. As shown in FIGS. 9A and/or 9B, etching the contact hole 902 can expose a portion of the first superconducting silicon electrode 102 (e.g., by removing at least a portion of the isolation layers 110 and/or the tunnel barrier 106 previously covering the first superconducting silicon electrode 102). Subsequent to etching the contact hole 902, the one or more resist masks 202 can be removed (e.g., via one or more etching processes), and/or the exposed surfaces of the qubit device 100 can be cleaned (e.g., using DHF).

Figure 25A:
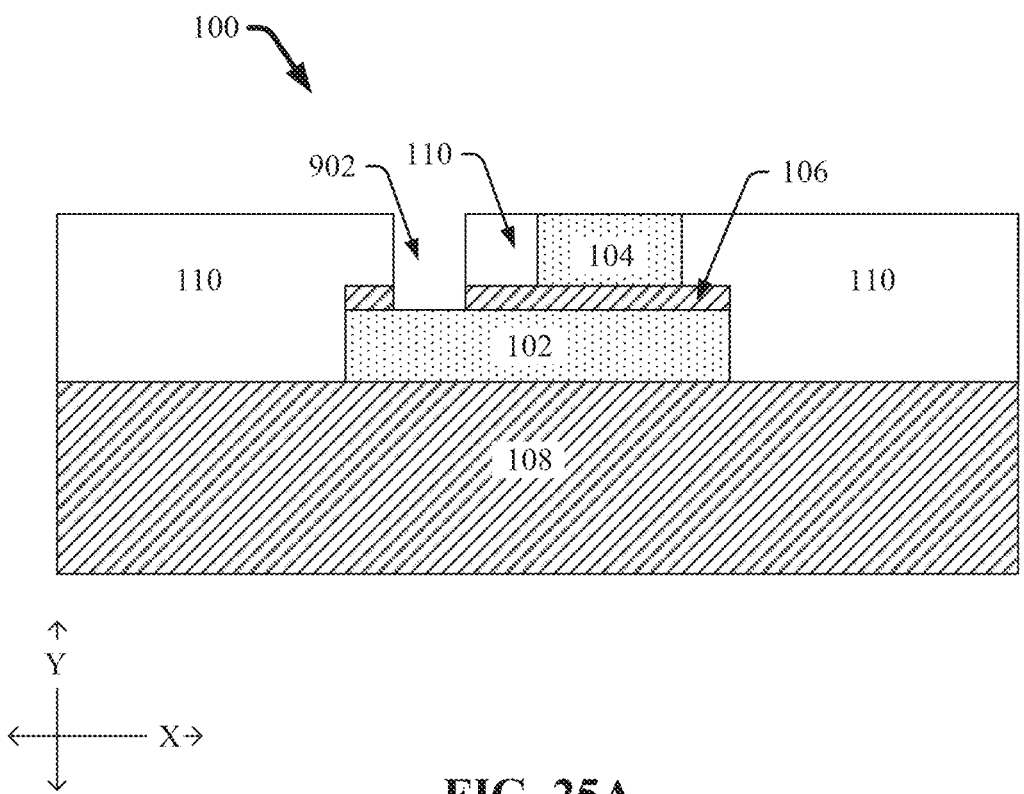
FIG. 25A illustrates a diagram of an example, non-limiting cross-sectional view of an apparatus comprising a silicon-based Josephson junction during a thirteenth stage of manufacturing in accordance with one or more embodiments described herein.
Figure 25B:
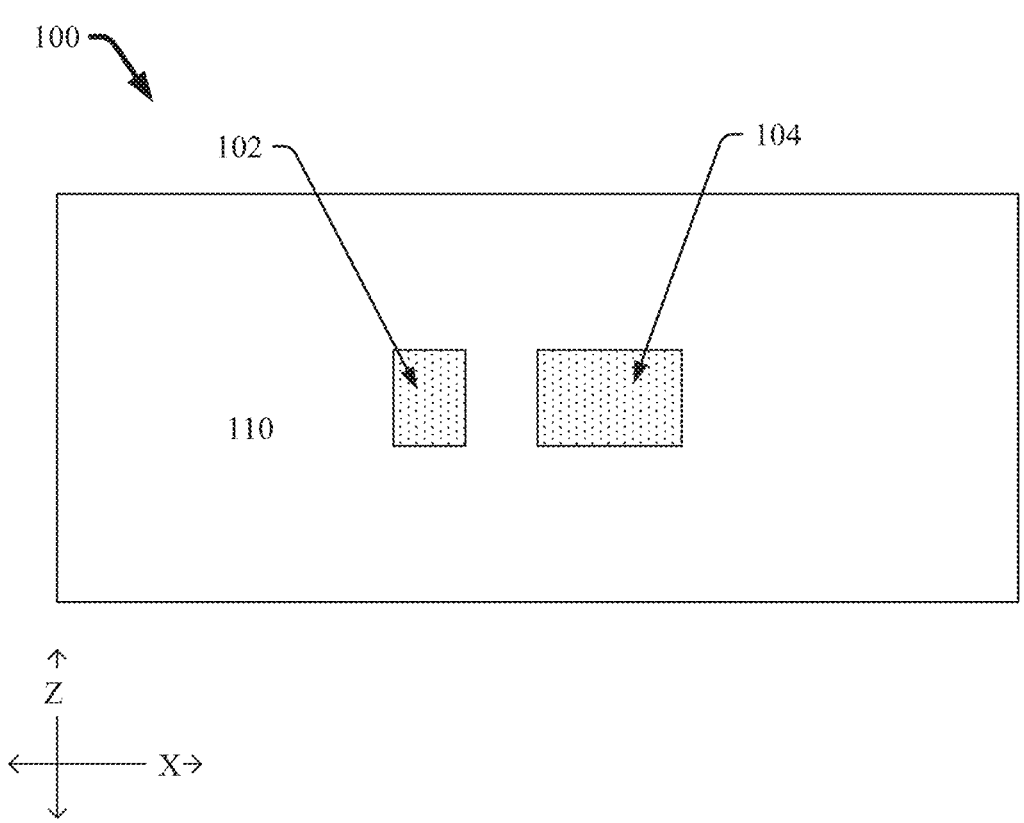
FIG. 25B illustrates a diagram of an example, non-limiting top-down view of an apparatus comprising a silicon-based Josephson junction during a thirteenth stage of manufacturing in accordance with one or more embodiments described herein.

FIGS. 25A and/or 25B illustrate diagrams of the example, non-limiting qubit device 100 during a thirteenth stage of manufacturing in accordance with one or more embodiments described herein. Repetitive description of like elements employed in other embodiments described herein is omitted for sake of brevity. FIG. 25A depicts a cross-sectional view of the qubit device 100 during the thirteenth stage of manufacturing, and/or FIG. 25B depicts a top-down view of the qubit device 100 during the thirteenth stage of manufacturing. During the thirteenth stage of manufacturing, the cap layer 1302 can be etched away (e.g., via one or more etching processes, such as RIE) to expose the second superconducting silicon electrode 104. Further, the exposed surfaces of the qubit device 100 can be cleaned (e.g., using DHF).

Figure 26A:
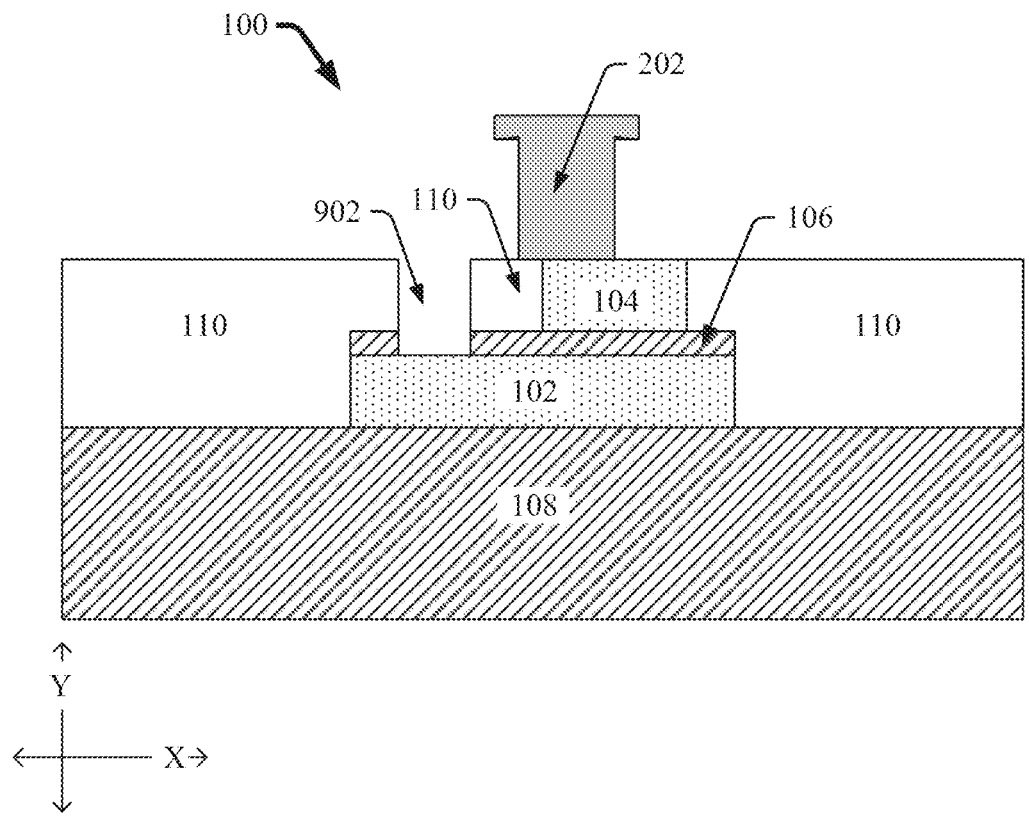
FIG. 26A illustrates a diagram of an example, non-limiting cross-sectional view of an apparatus comprising a silicon-based Josephson junction during a fourteenth stage of manufacturing in accordance with one or more embodiments described herein.
Figure 26B:
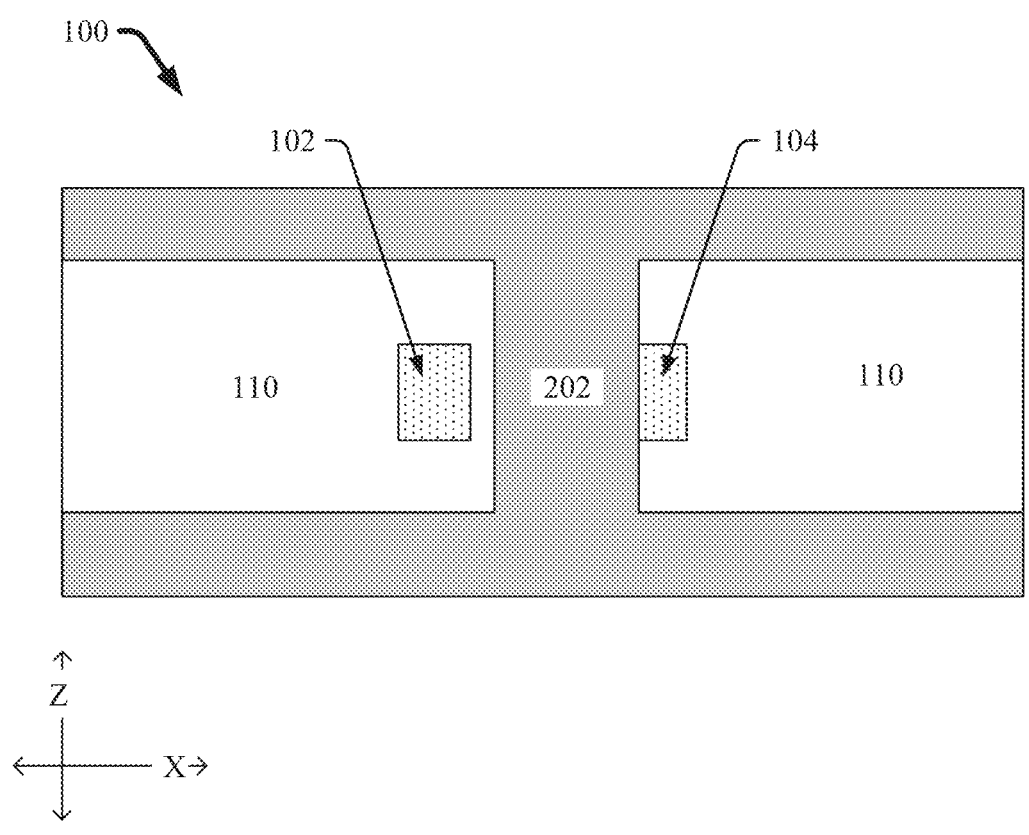
FIG. 26B illustrates a diagram of an example, non-limiting top-down view of an apparatus comprising a silicon-based Josephson junction during a fourteenth stage of manufacturing in accordance with one or more embodiments described herein.

FIGS. 26A and/or 26B illustrate diagrams of the example, non-limiting qubit device 100 during a fourteenth stage of manufacturing in accordance with one or more embodiments described herein. Repetitive description of like elements employed in other embodiments described herein is omitted for sake of brevity. FIG. 26A depicts a cross-sectional view of the qubit device 100 during the fourteenth stage of manufacturing, and/or FIG. 26B depicts a top-down view of the qubit device 100 during the fourteenth stage of manufacturing.

During the fourteenth stage of manufacturing, one or more resist masks 202 can be patterned onto the second superconducting silicon electrode 104 and/or isolation layers 110 (e.g., via one or more lift-off processes) to facilitate the formation of one or more metal contacts and/or the incorporation of one or more capacitors and/or resonators for the qubit device 100. As shown in FIGS. 26A and/or 26B at least a portion of the first superconducting silicon electrode 102 and/or the second superconducting silicon electrode can remain exposed by (e.g., not covered by) the one or more resist masks 202.

Figure 27A:
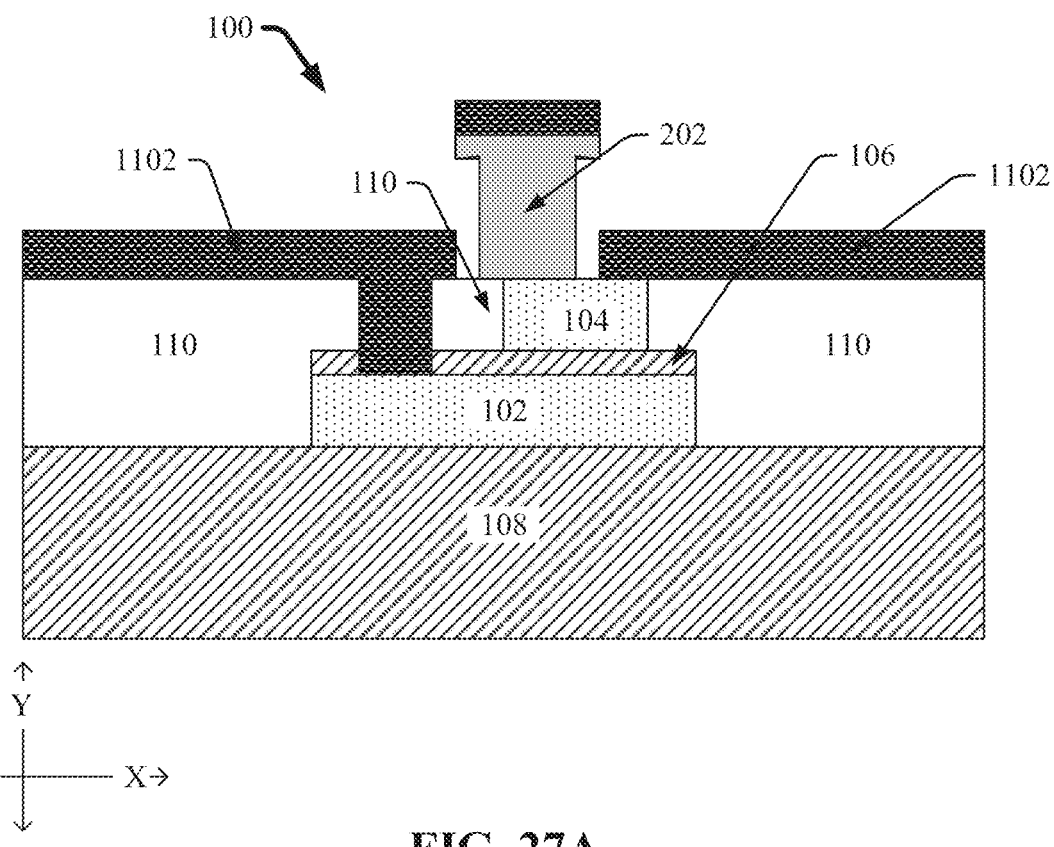
FIG. 27A illustrates a diagram of an example, non-limiting cross-sectional view of an apparatus comprising a silicon-based Josephson junction during a fifteenth stage of manufacturing in accordance with one or more embodiments described herein.
Figure 27B:
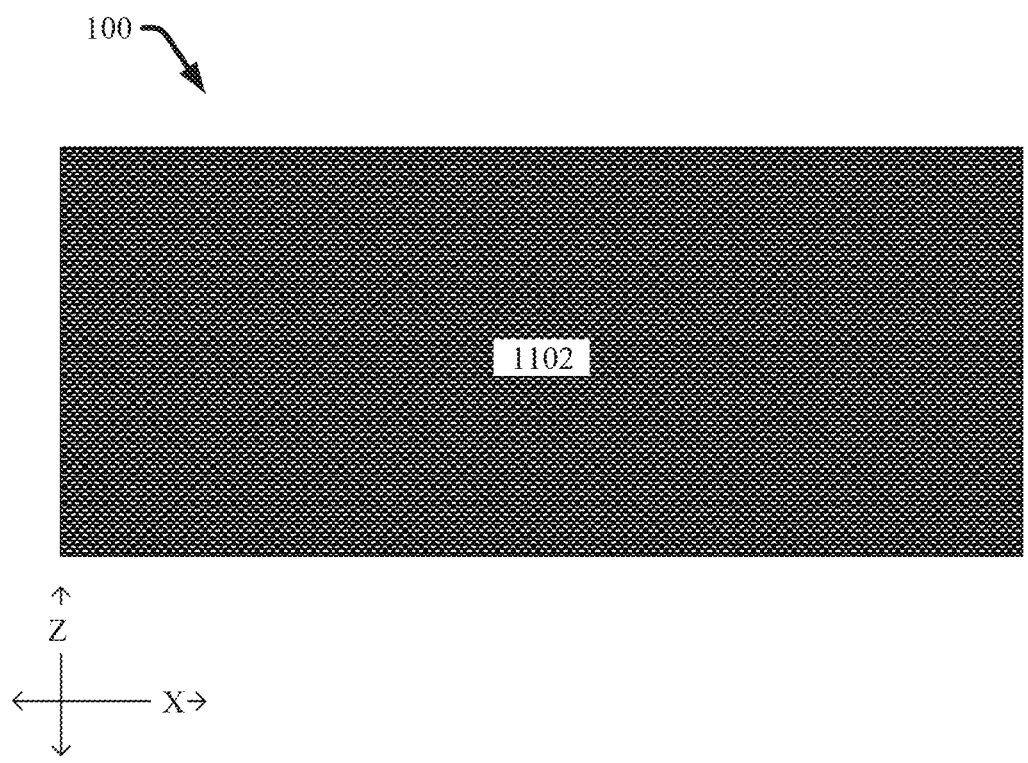
FIG. 27B illustrates a diagram of an example, non-limiting top-down view of an apparatus comprising a silicon-based Josephson junction during a fifteenth stage of manufacturing in accordance with one or more embodiments described herein.

FIGS. 27A and/or 27B illustrate diagrams of the example, non-limiting qubit device 100 during a fifteenth stage of manufacturing in accordance with one or more embodiments described herein. Repetitive description of like elements employed in other embodiments described herein is omitted for sake of brevity. FIG. 27A depicts a cross-sectional view of the qubit device 100 during the fifteenth stage of manufacturing, and/or FIG. 27B depicts a top-down view of the qubit device 100 during the fifteenth stage of manufacturing.

During the fifteenth stage of manufacturing, a conductive metal material 1102 can be deposited (e.g., via one or more deposition processes) onto the exposed surfaces of the qubit device 100 and/or the one or more resist masks 202. Subsequent to depositing the conductive metal material 1102, the resist mask 202 and portions of the conductive metal material 1102 positioned on the resist mask 202 can be removed (e.g., via one or more etching processes) to form the first metal contact 114 and/or second metal contact 116 (e.g., as shown in FIGS. 12A and/or 12B). Thereby, the conductive metal material 1102 can be the same metal comprised within the first metal contact 114 and/or second metal contact 116. As shown in FIG. 27A, the conductive metal material can be deposited into the contact hole 902 such that the conductive metal material is deposited onto the first superconducting silicon electrode 102. One of ordinary skill in the art will recognize that a thickness (e.g., along the "Y" axis) of the conductive metal material 1102 can vary depending on the function of the qubit device 100 and/or structural characteristics of the first metal contact 114 and/or second metal contact 116.

Figure 28:
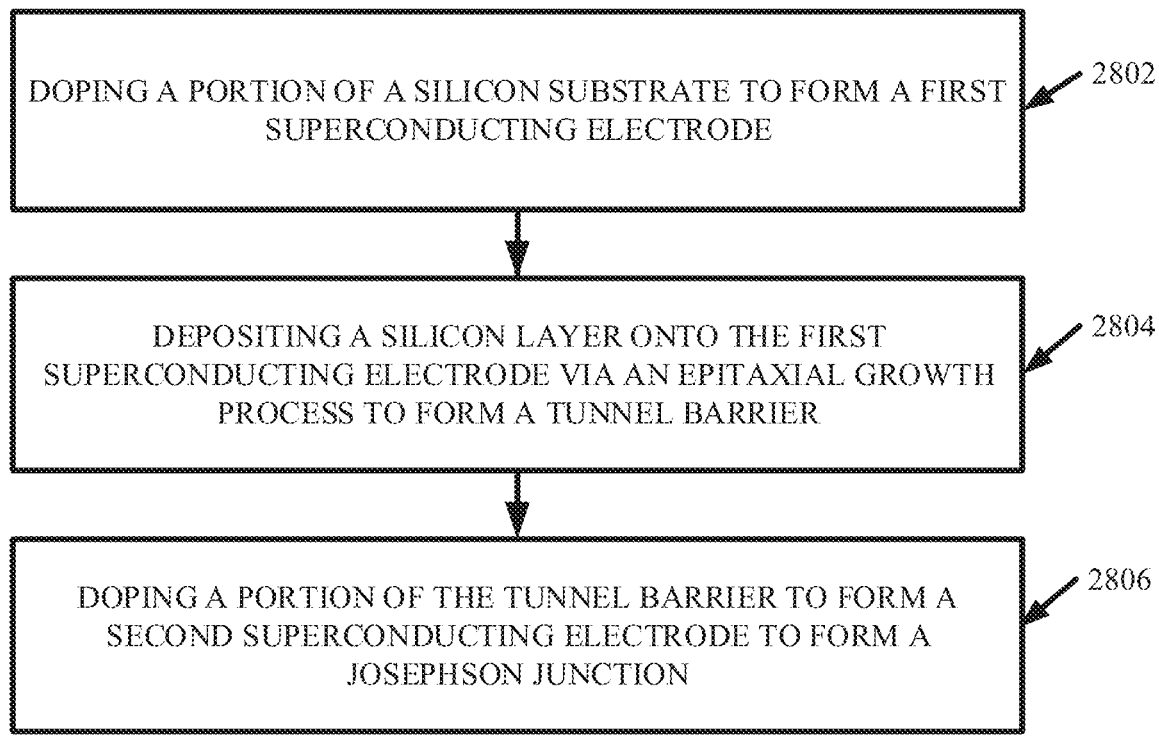
FIG. 28 illustrates a flow diagram of an example, non-limiting method that can facilitate manufacturing one or more silicon-based Josephson junctions in accordance with one or more embodiments described herein.

FIG. 28 illustrates a flow diagram of an example, non-limiting method 2800 that can facilitate manufacturing one or more qubit devices 100 comprising one or more silicon-based Josephson junctions in accordance with one or more embodiments described herein. Repetitive description of like elements employed in other embodiments described herein is omitted for sake of brevity.

At 2802, the method 2800 can comprise doping a portion of a semiconductor substrate 108 to form a first superconducting electrode (e.g., first superconducting silicon electrode 102). For example, the doping at 2802 can be performed in accordance with the second stage of manufacturing depicted in at least FIG. 3. For instance, the first superconducting electrode can be the first superconducting silicon electrode 102, and/or the doping can comprise one or more laser doping processes in accordance with one or more embodiments described herein.

At 2804, the method 2800 can comprise depositing a silicon layer onto the first superconducting electrode via an epitaxial growth process to form a tunnel barrier 106. For example, the depositing at 2804 can be performed in accordance with the third stage of manufacturing depicted in at least FIG. 4. For instance, in one or more embodiments the depositing at 2804 can grow a layer of intrinsic silicon that can serve as a dielectric tunnel barrier 106 of a silicon-based Josephson junction during operation of the qubit device 100 at near zero temperatures. In another instance, the depositing at 2804 can further comprising doping one or more portions of the deposited silicon layer to form a normal metal tunnel barrier 106 in accordance with one or more embodiments described herein.

At 2806, the method 2800 can comprise doping one or more portions of the tunnel barrier 106 to form a second superconducting electrode (e.g., second superconducting silicon electrode 104) to form a Josephson junction. For example, the doping at 2806 can be performed in accordance with the fifth stage of manufacturing depicted in at least FIGS. 6A and/or 6B. For instance, the second superconducting electrode can be the second superconducting silicon electrode 104, and/or the doping can comprise one or more laser doping processes in accordance with one or more embodiments described herein. In various embodiments, the Josephson junction formed by method 2800 can be a silicon-based Josephson junction comprising superconducting silicon electrodes. Further, the superconducting silicon electrodes can be stacked in a vertical orientation. Additionally, in one or more embodiments the tunnel barrier 106 can be a dielectric tunnel barrier comprising intrinsic silicon.

Figure 29:
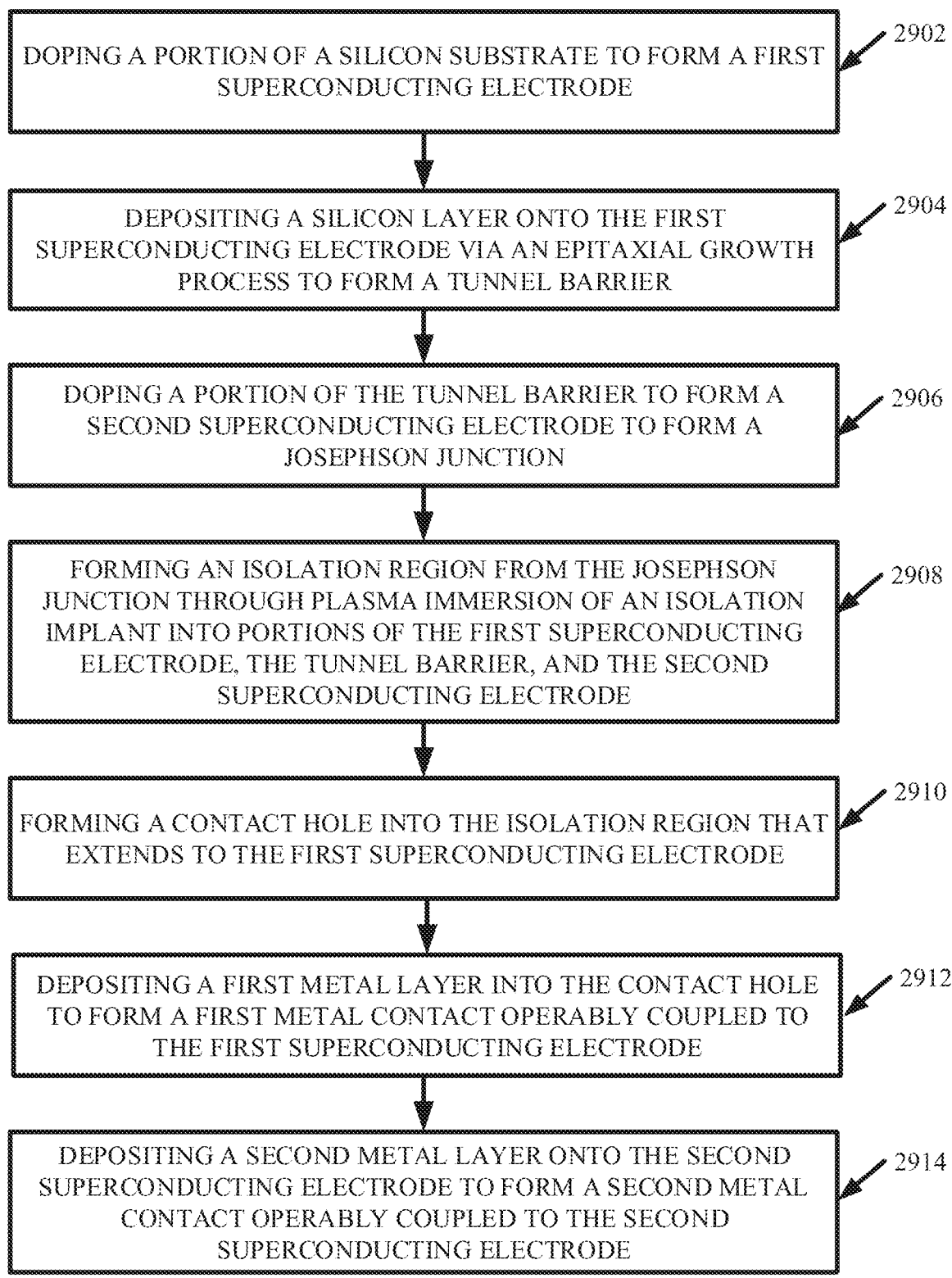
FIG. 29 illustrates a flow diagram of an example, non-limiting method that can facilitate manufacturing one or more silicon-based Josephson junctions in accordance with one or more embodiments described herein.

FIG. 29 illustrates a flow diagram of an example, non-limiting method 2900 that can facilitate manufacturing one or more qubit devices 100 comprising one or more silicon-based Josephson junctions electrically isolated via one or more isolation layers 110 that can include one or more isolation implants in accordance with one or more embodiments described herein. Repetitive description of like elements employed in other embodiments described herein is omitted for sake of brevity.

At 2902, the method 2900 can comprise doping a portion of a semiconductor substrate 108 to form a first superconducting electrode (e.g., first superconducting silicon electrode 102). For example, the doping at 2902 can be performed in accordance with the second stage of manufacturing depicted in at least FIG. 3. For instance, the first superconducting electrode can be the first superconducting silicon electrode 102, and/or the doping can comprise one or more laser doping processes in accordance with one or more embodiments described herein.

At 2904, the method 2900 can comprise depositing a silicon layer onto the first superconducting electrode via an epitaxial growth process to form a tunnel barrier 106. For example, the depositing at 2904 can be performed in accordance with the third stage of manufacturing depicted in at least FIG. 4. For instance, in one or more embodiments the depositing at 2904 can grow a layer of intrinsic silicon that can serve as a dielectric tunnel barrier 106 of a silicon-based Josephson junction during operation of the qubit device 100 at near zero temperatures. In another instance, the depositing at 2904 can further comprising doping one or more portions of the deposited silicon layer to form a normal metal tunnel barrier 106 in accordance with one or more embodiments described herein.

At 2906, the method 2900 can comprise doping one or more portions of the tunnel barrier 106 to form a second superconducting electrode (e.g., second superconducting silicon electrode 104) to form a Josephson junction. For example, the doping at 2806 can be performed in accordance with the fifth stage of manufacturing depicted in at least FIGS. 6A and/or 6B. For instance, the second superconducting electrode can be the second superconducting silicon electrode 104, and/or the doping can comprise one or more laser doping processes in accordance with one or more embodiments described herein. In various embodiments, the Josephson junction formed at 2906 can be a multi-layer stack structure, such as the multi-layer stack depicted in FIG. 13, wherein one or more subsequent manufacturing processes can further define one or more structural features of the Josephson junction and/or electrically isolate the Josephson junction via the incorporation of isolation implants.

At 2908, the method 2900 can comprise forming an isolation region 112 from the Josephson junction through plasma immersion of one or more isolation implants into portions of the first superconducting electrode (e.g., first superconducting silicon electrode 102), tunnel barrier 106, and the second superconducting electrode (e.g., second superconducting silicon electrode 104). For example, forming the isolation region at 2908 can be performed in accordance with the fifth to tenth stages of manufacturing depicted in FIGS. 17A to 22B. For instance, forming the isolation region at 2908 can comprise one or more plasma immersion processes and/or annealing process in accordance with one or more embodiments described herein.

At 2910, the method 2900 can comprise forming a contact hole 902 into the isolation region 112 that can extend to the first superconducting electrode (e.g., first superconducting silicon electrode 102). For example, forming the contact hole 902 can be performed in accordance with the eleventh to twelfth stages of manufacturing depicted in FIGS. 23A to 24B.

At 2912, the method 2900 can comprise depositing a first metal layer (e.g., conductive metal material 1102) into the contact hole 902 to form a first metal contact 114 operably coupled to the first superconducting electrode (e.g., first superconducting silicon electrode 102). For example, forming the first metal contact 114 at 2912 can be performed in accordance with the fourteenth and/or fifteenth stages of manufacturing depicted in FIGS. 26A-27B and/or 12A-12B.

At 2914, the method 2900 can comprise depositing a second metal layer (e.g., conductive metal material 1102) onto the second superconducting electrode (e.g., second superconducting silicon electrode 104) to form a second metal contact 116 operably coupled to the second superconducting electrode (e.g., second superconducting silicon electrode 104). For example, forming the first metal contact 114 at 2914 can be performed in accordance with the fourteenth and/or fifteenth stages of manufacturing depicted in FIGS. 26A-27B and/or 12A-12B.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
a Josephson junction comprising a tunnel barrier positioned between two vertically stacked superconducting silicon electrodes, wherein the two vertically stacked superconducting electrodes comprise a first superconducting electrode and a second superconducting electrode, and wherein the first superconducting silicon electrode and the second superconducting silicon electrode each comprise a laser doped crystalline silicon material doped with boron, wherein a concentration of the boron in each of the first superconducting electrode and the second superconducting electrode is greater than or equal to 4 atomic percent boron and less than or equal to 11 atomic percent boron; and
isolation layer positioned on the tunnel barrier and connected to a first side of the first superconducting electrode and a second side of the first superconducting electrode such that the isolation layer electrically isolates the first side of the first superconducting electrode and the second side of the first superconducting electrode, the first side being opposite the second side.

2. The apparatus of claim 1, wherein the two vertically stacked superconducting silicon electrodes also comprise silicon doped with at least one other dopant selected from the group consisting of gallium, and germanium.

3. The apparatus of claim 1, further comprising:
a first metal contact operably coupled to a first superconducting silicon electrode from the two vertically stacked superconducting silicon electrodes; and
a second metal contact operably coupled to a second superconducting silicon electrode from the two vertically stacked superconducting silicon electrodes, wherein the
isolation layer positioned on the tunnel barrier such that the isolation layer electrically isolates the first metal contact from the second metal contact, wherein the isolation layer comprises a carbon implantation within silicon.

4. The apparatus of claim 1, further comprising:
a first metal contact operably coupled to a first superconducting silicon electrode from the two vertically stacked superconducting silicon electrodes; and
a second metal contact operably coupled to a second superconducting silicon electrode from the two vertically stacked superconducting silicon electrodes, wherein the
isolation layer positioned on the tunnel barrier such that the isolation layer electrically isolates the first metal contact from the second metal contact, wherein the isolation layer comprises intrinsic silicon.

5. The apparatus of claim 1, wherein the tunnel barrier is doped with at least one dopant selected from the group consisting of phosphorus and arsenic.

6. The apparatus of claim 1, wherein the tunnel barrier comprises intrinsic crystalline silicon.

7. An apparatus, comprising:
a Josephson junction comprising a dielectric tunnel barrier positioned between two superconducting silicon electrodes, wherein the superconducting silicon electrodes comprise a first superconducting electrode and a second superconducting electrode, and wherein at least one of the first superconducting silicon electrode or the second superconducting silicon electrode comprises a laser doped crystalline silicon material doped with boron, wherein a concentration of the boron in the first superconducting electrode or the second superconducting electrode is greater than or equal to 4 atomic percent boron and less than or equal to 11 atomic percent boron; and
isolation layer positioned on the dielectric tunnel barrier and connected to a first side of the first superconducting electrode and a second side of the first superconducting electrode such that the isolation layer electrically isolates the first side of the first superconducting electrode and the second side of the first superconducting electrode, the first side being opposite the second side.

8. The apparatus of claim 7, wherein the two superconducting silicon electrodes comprise silicon doped with at least one other dopant selected from the group consisting of germanium, and gallium.

9. The apparatus of claim 7, further comprising:
a first metal contact operably coupled to a first superconducting silicon electrode from the two superconducting silicon electrodes; and
a second metal contact operably coupled to a second superconducting silicon electrode from the two superconducting silicon electrodes, wherein the
isolation layer is positioned on the dielectric tunnel barrier such that the isolation layer electrically isolates the first metal contact from the second metal contact, wherein the isolation layer comprises a carbon implantation within silicon.

10. The apparatus of claim 7, further comprising:
a first metal contact operably coupled to a first superconducting silicon electrode from the two superconducting silicon electrodes; and
a second metal contact operably coupled to a second superconducting silicon electrode from the two superconducting silicon electrodes, and wherein the
isolation layer positioned on the dielectric tunnel barrier such that the isolation layer electrically isolates the first metal contact from the second metal contact, wherein the isolation layer comprises intrinsic silicon.

11. The apparatus of claim 7, wherein the dielectric tunnel barrier comprises intrinsic crystalline silicon.

12. The apparatus of claim 7, wherein the two superconducting silicon electrodes and the dielectric tunnel barrier are vertically stacked on a dielectric substrate.

* * * * *